United States Patent [19]
Conlan et al.

[11] Patent Number: 5,938,187
[45] Date of Patent: Aug. 17, 1999

[54] MEDIA FEED APPARATUS FOR AN IMAGING DEVICE

[75] Inventors: Joseph J. Conlan, Rocky Hill; James M. Diener, Niantic; Alan W. Menard, Bolton; John R. Masotta, Bethany; Richard S. Lech, Manchester; Michael T. Silva, Enfield; Bruce L. Davidson, East Hartford, all of Conn.

[73] Assignee: Gerber Systems Corporation, South Windsor, Conn.

[21] Appl. No.: 08/844,668

[22] Filed: Apr. 18, 1997

[51] Int. Cl.$^6$ ........................................... B65H 5/22
[52] U.S. Cl. ............................ 271/3.14; 271/4.01; 271/5; 271/84
[58] Field of Search ................ 271/3.14, 4.01, 271/5, 267, 84, 85

[56] References Cited

U.S. PATENT DOCUMENTS

| | | | |
|---|---|---|---|
| 3,272,568 | 7/1966 | Koorneef et al. | 308/5 |
| 3,411,075 | 11/1968 | Kahoun | 324/34 |
| 3,462,680 | 8/1969 | Kahoun et al. | 324/24 |
| 3,525,929 | 8/1970 | Mounce | 324/34 |
| 3,816,659 | 6/1974 | Landsman | 178/7.6 |
| 3,894,276 | 7/1975 | Janssen | 318/135 |
| 3,938,191 | 2/1976 | Jarmy | 360/102 |
| 4,012,676 | 3/1977 | Giebler | 318/135 |
| 4,028,732 | 6/1977 | Salter et al. | 358/289 |
| 4,131,916 | 12/1978 | Landsman | 358/285 |
| 4,186,991 | 2/1980 | Koide et al. | 350/6.91 |
| 4,209,239 | 6/1980 | Wood et al. | 354/4 |
| 4,348,697 | 9/1982 | Takahashi et al. | 358/286 |
| 4,385,297 | 5/1983 | Schmitt et al. | 340/870.31 |
| 4,387,452 | 6/1983 | Bricot et al. | 369/32 |
| 4,402,061 | 8/1983 | Hazel et al. | 365/127 |
| 4,409,624 | 10/1983 | Kingsley | 358/285 |
| 4,413,863 | 11/1983 | Lombard | 308/5 |
| 4,415,911 | 11/1983 | Tazaki | 346/140 |

(List continued on next page.)

FOREIGN PATENT DOCUMENTS 30 14 409 10/1980 Germany.
44 11 574 5/1995 Germany.
2 049 300 12/1980 United Kingdom.

OTHER PUBLICATIONS

"The Amateur Scientist" by Shawn Carlson, Scientific American, Aug. 1996, pp. 96, 98–99.
"Linear Motor Applications" by Boaz Eidelberg, Anorad Corp., Oct. 1992, 4 sheets.

(List continued on next page.)

*Primary Examiner*—David H. Bollinger
*Attorney, Agent, or Firm*—McCormick, Paulding & Huber

[57] ABSTRACT

An apparatus for feeding media to an internal drum imaging system includes a pair of parallel rails secured to a support frame that is mechanically isolated from the imaging system. The tracks are parallel to the outer circumferential edges of the internal drum. The feeding apparatus further includes a plurality of media engagement means movably coupled between the tracks. The engagement means are adapted to transport the medium to and from the internal drum along the tracks. Each engagement means includes a rail extending between the tracks and a pair of drive means pivotally connected to the ends of the rail for advancing the rail along the tracks. Each engagement means further includes a lifting means for raising and lowering the rail and a coupling means disposed to the undersurface of the rail for securing the media to the rail. The feeding apparatus further includes a controller which provides signals to the engagement means to couple the media to the rails and advance the engagement means along the tracks and accurately position the medium onto the drum, in response to an algorithm and feedback from a pair of docking sensor. The docking sensor are disposed on the leading edge of internal drum for contacting the leading edge of the medium and providing a signal to the controller representative of the position of the medium on the internal drum.

38 Claims, 26 Drawing Sheets

U.S. PATENT DOCUMENTS

| | | | |
|---|---|---|---|
| 4,432,082 | 2/1984 | Hsieh et al. | 369/32 |
| 4,432,083 | 2/1984 | Hsieh et al. | 369/44 |
| 4,435,797 | 3/1984 | Hseih et al. | 369/32 |
| 4,443,870 | 4/1984 | Hazel et al. | 369/44 |
| 4,445,798 | 5/1984 | Munehiro | 400/320 |
| 4,455,910 | 6/1984 | Kraft et al. | 83/874 |
| 4,543,615 | 9/1985 | Van Campenhout et al. | 358/285 |
| 4,550,252 | 10/1985 | Tee | 250/223 |
| 4,585,331 | 4/1986 | Stoffel et al. | 355/8 |
| 4,666,315 | 5/1987 | Scranton | 384/1 |
| 4,700,368 | 10/1987 | Munn et al. | 377/8 |
| 4,704,712 | 11/1987 | Siryj | 369/249 |
| 4,777,979 | 10/1988 | Twerdochlib | 137/554 |
| 4,798,478 | 1/1989 | Crystal | 384/12 |
| 4,834,353 | 5/1989 | Chitayat | 269/73 |
| 4,865,310 | 9/1989 | Hunter et al. | 271/84 X |
| 4,879,513 | 11/1989 | Spiegel et al. | 324/207 |
| 4,985,651 | 1/1991 | Chitayat | 310/12 |
| 5,049,030 | 9/1991 | Lockert | 271/84 X |
| 5,079,502 | 1/1992 | Rogacki et al. | 324/207.19 |
| 5,098,203 | 3/1992 | Henderson | 384/12 |
| 5,204,633 | 4/1993 | Ahladas et al. | 324/654 |
| 5,228,358 | 7/1993 | Sakino et al. | 74/479 |
| 5,387,995 | 2/1995 | Harig | 359/204 |
| 5,436,695 | 7/1995 | Lucking et al. | 355/76 |
| 5,504,426 | 4/1996 | Ricci et al. | 324/207.17 |
| 5,553,839 | 9/1996 | Wolfson | 271/3.11 |
| 5,558,320 | 9/1996 | Menard et al. | 271/4.01 |
| 5,619,246 | 4/1997 | Straayer et al. | 347/262 |
| 5,640,473 | 6/1997 | Wheeler et al. | 385/27 |
| 5,655,452 | 8/1997 | Blake et al. | 101/477 |
| 5,821,981 | 10/1998 | Menard et al. | 347/260 |
| 5,828,501 | 10/1998 | Menard et al. | 359/819 |
| 5,841,567 | 11/1998 | Squires et al. | 359/212 |

OTHER PUBLICATIONS

"Air Bearings, Technology & Applications" by Robert Kody, Dover Instrument Corporation, Nov./Dec. 1992, 3 sheets.

"Accuracy in Positioning Systems" by Kevin McCarthy, New England Affiliated Technologies, 15 sheets.

"Positioning Systems: An Overview" by Kevin McCarthy, New England Affiliated Technologies, 11 sheets.

Literature re Trilogy.

Literature re Linear Motor Applications Note, New England Affiliated Technologies, 6 sheets.

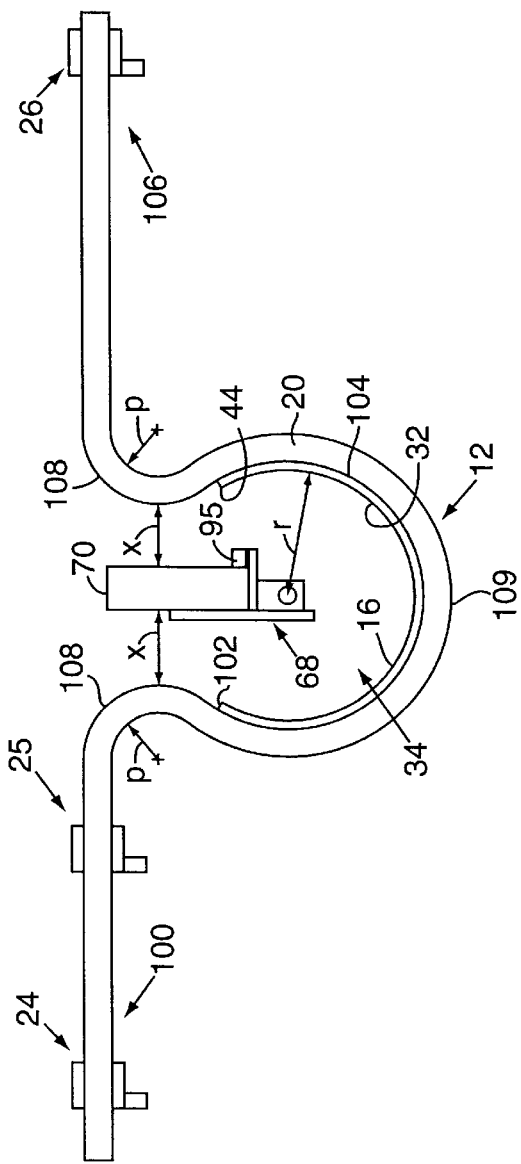
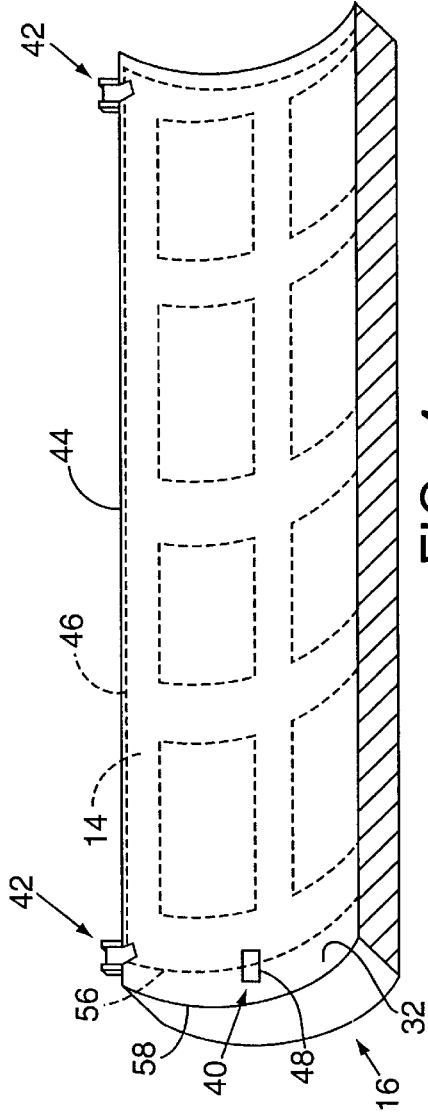
FIG. 3
FIG. 4

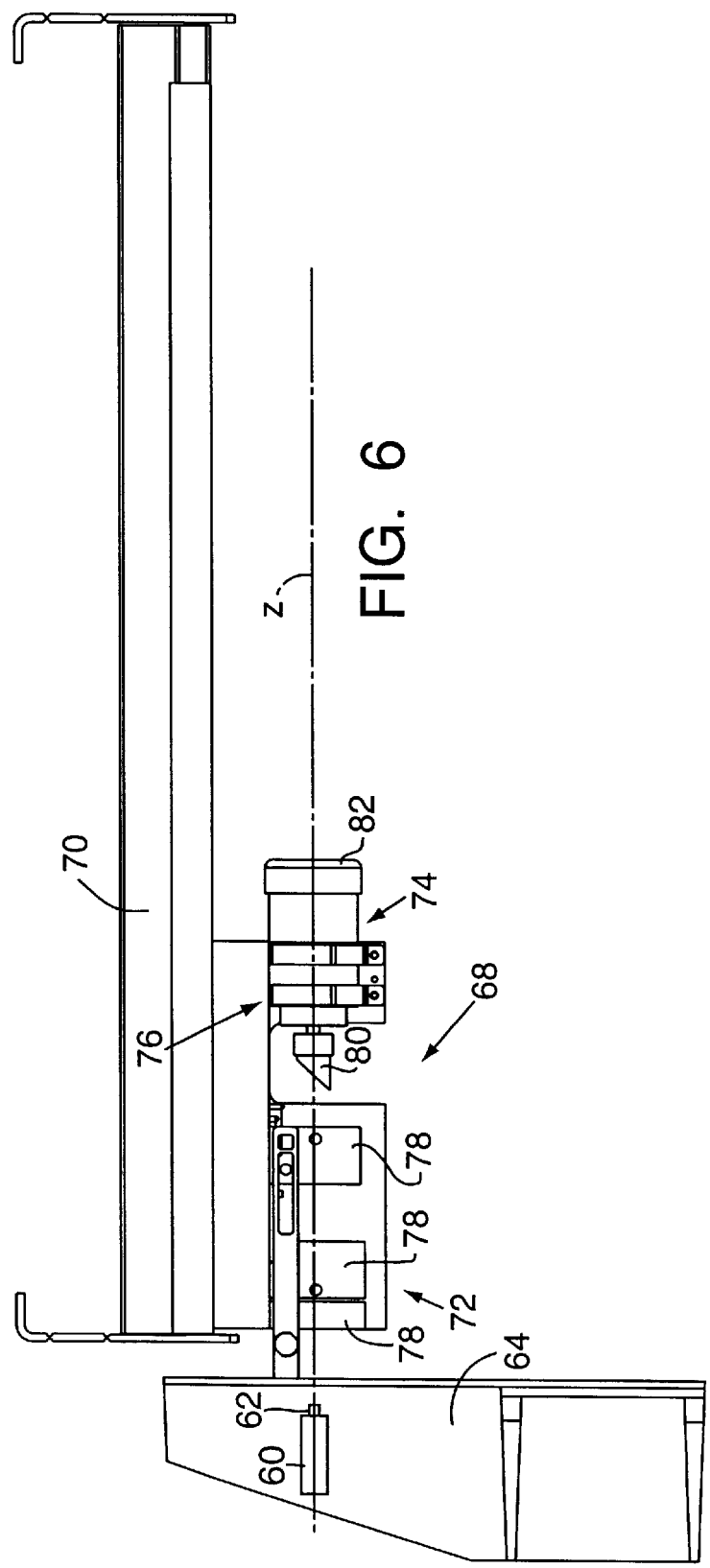

MEDIA FEED APPARATUS FOR AN IMAGING DEVICE

CROSS REFERENCES TO RELATED APPLICATIONS

Some of the matter contained herein is disclosed in the commonly owned U.S. Pat. No. 5,828,501, issued Oct. 27, 1998, entitled "Apparatus And Method For Positioning A Lens To Expand An Optical Beam Of An Imaging System" and U.S. Pat. No. 5841,567, issued Nov. 24,1998, entitled "A Method And Apparatus For Imaging At A Plurality Of Wavelengths" and U.S. Pat. No. 5,640,473, issued Jun. 17, 1997 entitled "Method And Apparatus For Generating An Optical Beam For Use In An Imaging System" and U.S. Pat. No. 5,821,981, issued Oct. 13, 1998 entitled "Magnetically Preloaded Air Bearing Motion System For An Imaging Device" and pending U.S. patent application Ser. No. 08/844,250 filed Apr. 18, 1997, entitled "Multiple Beam Scanning System For An Imaging Device" (Attorney Docket No. I48-1076) and pending U.S. patent application Ser. No. 08/844,267 filed Apr. 18, 1997, entitled "Method For Manufacturing A Drum Assembly For An Internal Drum Imaging Device And A Drum Assembly" (Attorney Docket No. I48-1123). Each of the foregoing patent applications are incorporated herein by reference.

FIELD OF THE INVENTION

This invention relates to imaging devices and, more particularly to an apparatus and method for loading media onto and off of a scanning surface of an internal drum of an imaging device.

BACKGROUND OF THE INVENTION

Imaging devices of planar, external drum and internal drum design, such as photoplotters and scanners, are known in the art. Scanners function by illuminating the test sample with an unmodulated optical beam and capturing the reflected or transmitted light after it leaves the copy. The transmitted or reflected optical signals are received by a detector and recorded.

Photoplotters are used in the field of graphic arts and the fabrication of printed circuit boards. Planar imaging systems, such as are disclosed and claimed in U.S. Pat. No. 4,851,656 and incorporated herein by reference, are types of imaging systems which have a planar surface for receiving a substrate or media. An optical exposure head is located on a movable gantry apparatus and is rastered above the media during exposure.

Internal drum devices have a cylindrical surface portion to receive the media. An optical beam generator emits a modulated optical feed beam onto a parabolic spinning mirror, and the mirror reflects the beam onto the media. As the mirror spins, the reflected imaging beam advances across the media surface from one side edge of the surface to an other side edge thereof, exposing a sequence of pixels which together form a scan line perpendicular to the axis of the drum. The spinning mirror is mounted on a carriage which moves along a spar parallel to the axis of the drum and perpendicular to the scan line. The carriage moves continuously so that the imaging process is helical along the cylinder. The rotating imaging beam advances across the surface area of the drum in this manner until the entire image is exposed to the media.

In the internal drum system, the optical imaging beam is exposed to air turbulence as it travels from the spinning mirror to the imaging surface of the drum. The air turbulence adversely effects the quality of the scanned image. It is known that the greater the beam travels the greater the likelihood of the adverse effects of the air turbulence and therefore, it is desirable for the radius of the drum to be as small as possible. However, the width and flexibility of the media plate and the clearance necessary to load the plate onto the drum limits how small the radius of the drum may be.

The smaller internal drum imaging devices expose plates of media typically having dimensions of 21"×24" for 4-up format printing and plates of 32"×42" for plates of 8-up media printing format. The widths of the smaller plates permit the radius of the internal drum to be sufficiently small and yet provide sufficient space between the drum and the spar to easily load and unload the plates of media onto and off of the drum.

The dimensions of the larger media plates for larger imaging devices capable of exposing media of large (i.e. 16-up) format printing are approximately 52" by 68". The handling and loading of the larger media onto the internal drum is difficult and requires the assistance of two individuals. However, the increased diameter of the internal drums of imaging devices for scanning the larger media substantially increases the imaging beams susceptibility to air turbulence within the exposure chamber of the internal drum.

Accordingly, it is an object of the present invention to provide a media feed apparatus for an imaging device that reduces the cycle time to load and remove large plates of media onto or from an internal drum.

It is another object to provide a media feed apparatus for an imaging device that reduces the difficulty to feed a large sheet of media onto the internal drum.

It is a further object to provide a media feed apparatus for an imaging device that permits one individual to load the large plates of media onto the internal drum of the imaging device.

It is yet another object to provide a media feed apparatus for an imaging device that accurately and remotely positions a media plate onto the internal drum of the imaging device.

It is still a further object to provide a media feed apparatus for an imaging device that reduces the effects of air turbulence the imaging beam.

SUMMARY OF THE INVENTION

According to the present invention, a media feed apparatus for use in an imaging system for loading medium onto and unloading medium off of an internal drum of the imaging system, the drum having a rearward edge and forward edge, the imaging device further including a scanning assembly disposed within the internal drum parallel to the central axis of the internal drum, the apparatus comprising a support structure and a pair of parallel tracks secured to the structure. The tracks have a rearward portion extending generally perpendicular from the rearward edge of the internal drum, an intermediate portion adjacent the outer edges of the internal drum and a forward portion extending generally perpendicular from the forward edge of the internal drum. The media feed apparatus further includes a forward engagement means movably coupled between the tracks for coupling a leading edge portion of the medium, and transporting the medium to and from the internal drum along the tracks. The engagement means includes a rail extending between tracks, a drive means secured to each end of the rail for advancing rail along the tracks in response to drive signals, and a coupling means mounted to the rail for securing the media to the rail in response to coupling signals. The media feed apparatus also includes a controller for generating the drive signals and the coupling signals in response to received media advancement signals.

Another aspect of the present invention is an imaging system comprising a scanning assembly, an internal drum for securing media to be scanned and a media feed apparatus for loading and unloading medium onto and off of the internal drum. The media feed apparatus includes a support structure and a pair of parallel tracks secured to the structure. The tracks have a rearward portion extending generally perpendicular from the rearward edge of the internal drum, an intermediate portion adjacent outer edges of the internal drum and a forward portion extending generally perpendicular from the forward edge of the internal drum. The feed apparatus further includes a forward engagement means movably coupled between tracks for coupling a leading edge portion of the medium and transporting the medium to and from the internal drum along the tracks. The engagement means includes a rail extending between tracks, a drive means secured to each end of the for advancing the rail along the tracks in response to drive signals, and a coupling means mounted to the rail for securing the media to rail in response to coupling signals. The feed apparatus also includes a controller for generating the drive signals and the coupling signals in response to received media advancement signals.

Another aspect of the present invention is a controller for loading and unloading a medium onto and off of a scanning surface of an internal drum of an imaging device. The imaging device includes a scanning assembly within the internal drum disposed parallel to the central axis of the internal drum, a support structure, a pair of parallel tracks secured to the structure, a first engagement means and a second engagement means movably coupled between the tracks, and a pair of docking sensors disposed laterally at a forward edge of the internal drum. The controller comprises means for receiving a first position signal representative of the location of the first engagement means along the tracks, means for providing a first coupling signal to the first engagement means for releasably securing the first engagement means to a medium in response to the first position signal, means for receiving a second position signal representative of the location of the second engagement means along the tracks, and means for providing a second coupling signal to the second engagement means for releasably securing the second engagement means to a medium in response to the second position signal. The controller further includes means for a providing first drive signals to the first and second engagement means for advancing the first engagement means and second engagement means to a predetermined location on the tracks, means for receiving docking signals representative of the position of the medium disposed on the internal drum, and means for providing second driving signals to the first and second engagement means for advancing the medium to a desired position on the drum in response to the docking signals.

Another aspect of the invention is a method of loading and unloading a medium onto and off of a scanning surface of an internal drum of an imaging device. The imaging device includes a scanning assembly within the internal drum disposed parallel to the central axis of the internal drum, a support structure, a pair of parallel tracks secured to the structure, a first engagement means and a second engagement means movably coupled between the tracks, and a pair of docking sensors disposed laterally at a forward edge of the internal drum. The method comprises the steps of coupling the first engagement means to a trailing edge portion of the medium; coupling the second engagement means to a leading edge portion of the medium; advancing the first and second engagement means and medium forward to a predetermined location on the scanning surface of the internal drum; docking the medium onto the scanning surface; and unloading the medium from the internal drum after the media is scanned.

Another aspect of the present invention is a method of concurrently loading and unloading mediums onto and off of a scanning surface of an imaging device. The imaging device further including a scanning assembly within the internal drum parallel to the central axis of the internal drum, a support structure a pair of parallel tracks secured to the structure; a rearward engagement means, an intermediate engagement means and a forward engagement means movably coupled between the tracks for engaging and transporting the medium to the scanning surface, and a pair of docking sensors disposed laterally at the forward edge of the internal drum. The intermediate engagement means includes a forward coupling means and a rearward coupling means. The method comprises the steps of coupling the rearward engagement means to a trailing edge portion of the medium; coupling the rearward coupling means of the intermediate engagement means to the leading edge portion of the medium; advancing the rearward and intermediate engagement means and medium adjacent a scanned medium disposed on the scanning surface; advancing the forward engagement means to the forward edge portion of the scanned medium; coupling the forward coupling means of the intermediate engagement means to the trailing edge portion of the scanned medium; releasing medium from internal drum; advancing rearward and intermediate engagement means back a predetermined distance from the docking sensors; coupling the forward engagement means to the medium; lifting the scanned medium upward away from the scanning surface; advancing the rearward, intermediate and forward engagement means forward to a predetermined position; releasing the scanned medium from the intermediate engagement means at a predetermined location on the tracks; advancing the forward engagement means to an unloading position along the tracks; and docking the medium onto the scanning surface.

Another aspect of the present invention is a docking sensor for locating sheet material on a support surface. The docking sensor comprises a mounting frame, a sensing element secured to mounting frame, and a spring-loaded support secured to the mounting frame. The spring-loaded support has a first surface opposing the sensing element at a predetermined distance and a second surface for contacting the medium that enables movement of the first surface toward and away from the sensing element. The docking sensor further includes a stimulating element mounted to the first surface of the spring-loaded support, whereby the sensing element provides a sensing signal representative of the distance between the sensing element and the stimulating element.

Another aspect of the present invention is a docking assembly for locating sheet material on a support surface. The docking assembly comprises a pair of docking sensors laterally-disposed at predetermined locations at the support surface for contacting an edge of the sheet material. Each of the docking sensors comprising a mounting frame, a sensing element secured to the mounting frame, and a spring-loaded support secured to the mounting frame. The spring-loaded support has a first surface opposing the sensing element at a predetermined distance and a second surface for contacting the sheet material that enable movement of the first surface toward and away from the sensing element. Each docking sensor further includes a stimulating element mounted to the first surface of the spring-loaded support, whereby the sensing element provides a sensing signal representative of the distance between the sensing element and the stimulating element. The docking assembly further includes a controller generating an output signal representative the location of the sheet material on the support surface in response to the sensing signals.

Another aspect of the present invention is a method of locating sheet material on a support surface. The support surface includes a pair of docking sensors laterally-disposed at predetermined locations at the support surface for contacting an edge of the sheet material. The method comprises the steps of providing a first trigger signal for each of the docking sensors, said first trigger signal being indicative of the desired location of the sheet material; advancing the sheet material to the docking sensors; stopping the advancement of the sheet material when the sensing signal provided by one of the docking sensors is equivalent to the first trigger signal; advancing a portion of the sheet material to the other docking sensor and maintaining the other portion of the sheet material stationary; and stopping the advancement of the sheet material when the sensing signal provided by the other docking sensor is equivalent to the first trigger signal.

The above and other objects and advantages of this invention will become more readily apparent when the following description is read in conjunction with the accompanying drawings.

BRIEF DESCRIPTION OF THE DRAWINGS

FIG. 3 is a side elevational view of the tracks, engagement means, and scanning means of the imaging device of FIG. 1;

FIG. 4 is a perspective view of the internal drum, scanning means and media plate deflector of the imaging device of FIG. 1, shown partially broken away;

FIG. 6 is a front elevational view of the carriage and spar of the motion system of the imaging device of FIG. 1;

DETAILED DESCRIPTION OF THE PREFERRED EMBODIMENTS

Figure 1:
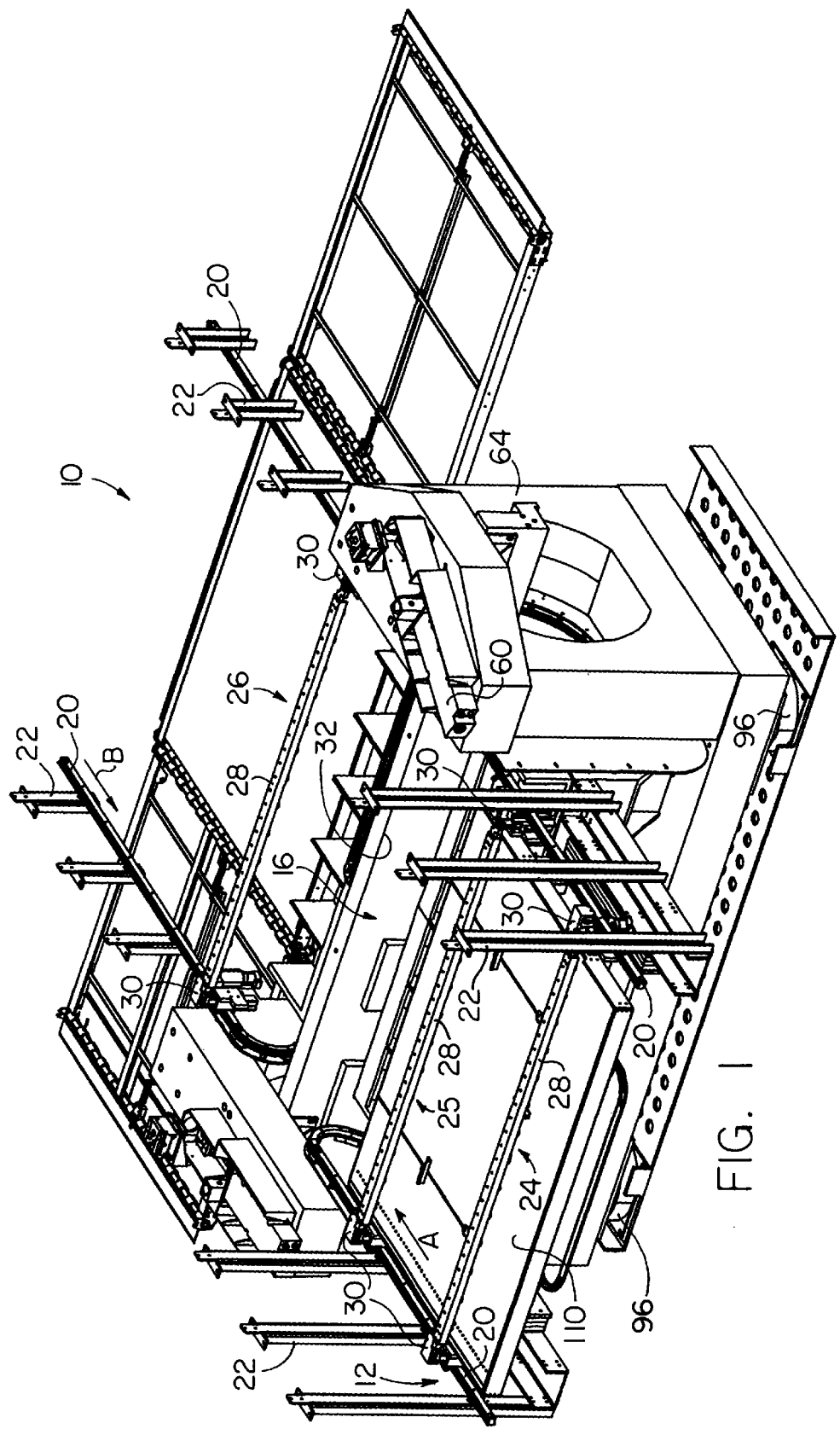
FIG. 1 is a perspective view of a preferred embodiment of an imaging device having a media feed apparatus in accordance with the present invention.

FIG. 1 illustrates an imaging device, generally designated 10, that includes a media feed apparatus 12 adapted to advance a sheet or plate of media 14 to and from an internal drum 16 to reduce the cycle time of loading, unloading and imaging (or scanning) each plate.

In general, imaging devices 10 include both photoplotters and scanners. Photoplotters expose a photosensitive media plate disposed on an imaging surface by sweeping a modulated optical beam produced by a beam generator over the media plate. Scanners function by illuminating the test sample with an unmodulated optical beam and capturing the reflected light by the beam receivers. The following description of the imaging device 10 pertains to a photoplotter, however, one skilled in the art would recognize that the present invention may also pertain to a scanner.

The feed apparatus includes a pair of parallel tracks 20,20 that are laterally-spaced slightly greater than the length of the internal drum 16. The tracks are maintained in fixed-spaced relations to the internal drum by a support frame 22 mounted thereto. In the preferred embodiment, the feed apparatus further includes three media engagement means 24–26 having a single rail 28 respectively, disposed transversely between the tracks 20,20. Each of the ends of the rails 28 are pivotally attached to a pair of drive assemblies 30 which advance the rails along the tracks 20 at a predetermined rate. The rails are adapted to releasably engage, such as by vacuum pressure, a media plate 14.

The media feed apparatus 12 is adapted to advance a media plate 14 and properly position the plate onto the interior surface 32 of the internal drum 16. As the media plate is being scanned or exposed, the feed apparatus advances the next media plate to the internal drum. After the media plate 14 disposed in the drum 16 is scanned, the feed apparatus re-engages the scanned media and moves it away from the drum of the imaging device 10 for further processing while the feed apparatus advances concurrently the next media plate to the drum, and thereby reduce the cycle time for scanning each media plate.

Figure 2:
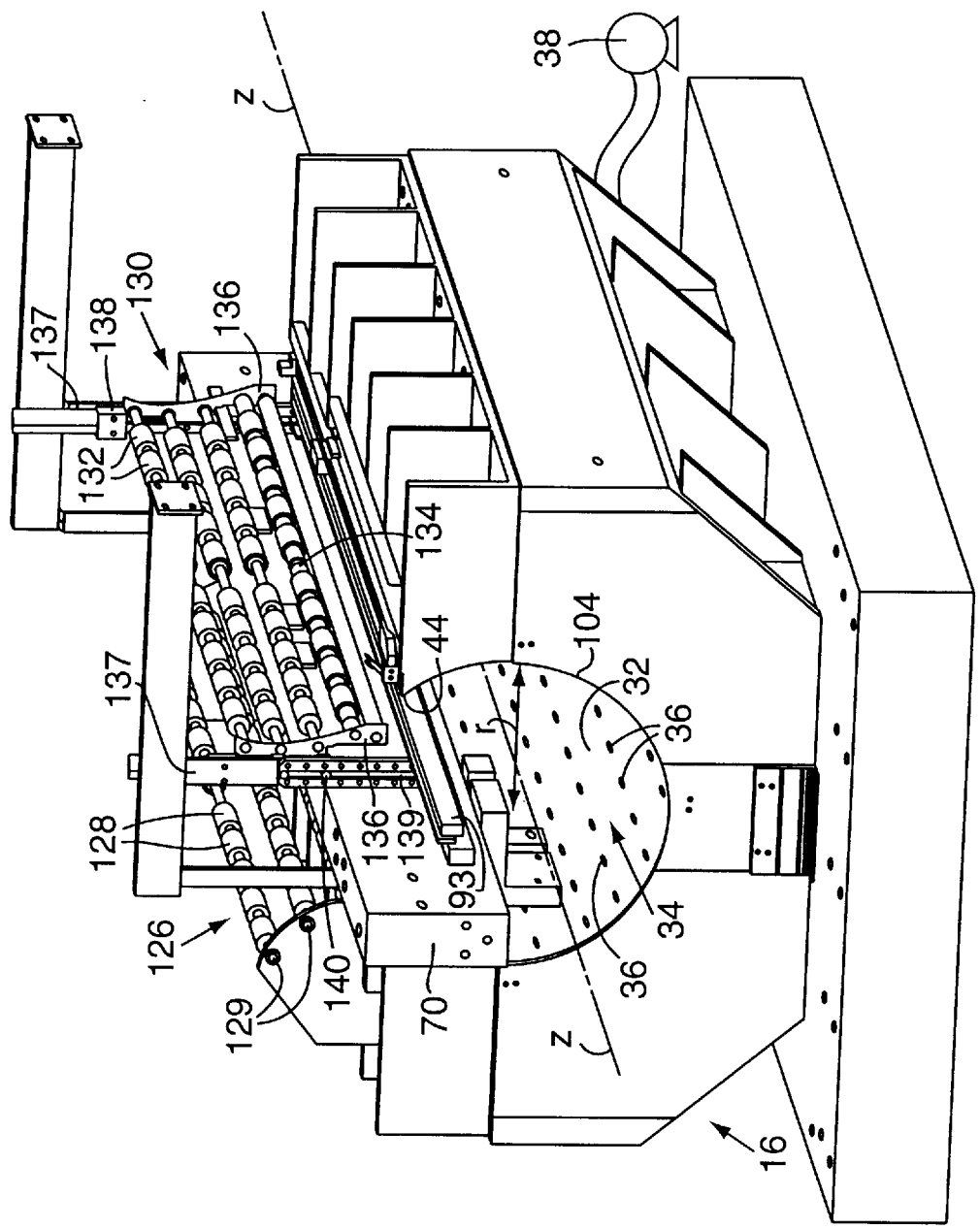
FIG. 2 is a perspective view of the internal drum, scanning means and media plate deflector of the imaging device of FIG. 1.

Referring to FIGS. 2 and 3, the internal drum 16 is a generally crescent-shaped cylindrical drum defining an exposure chamber 34. The interior surface 32 of the drum defines an internal support structure for supporting the media plate 14 within the exposure chamber 34 in a given orientation along the central axis z of the internal drum. The media plates may be a sheet of aluminum or polymer, such as polyester, having a photosensitive emulsion coated on one surface thereof or a sheet of photosensitive film. A plurality of apertures 36 defined by the support surface 32 of the internal drum 16 are provided for the purpose of drawing the media plate down onto the support surface under vacuum pressure applied by a vacuum pump 38 and associated manifold system (not shown) disposed below the drum in the lower portion of the structure to supply vacuum pressure to a forward, rearward and intermediate zones of the drum.

Typically, the circumferential extension of an internal drum 16 for an imaging device 10 is approximately 180 degrees or less to provide sufficient clearance to load the media plates 14 onto the drum. In the preferred embodiment shown in FIGS. 2 and 3, the cylindrical drum extends approximately 265 degrees. The greater circumferential extension of the drum reduces the radius r of the drum to thereby improve the immunity of the optical imaging beams to air turbulence in the exposure chamber 34 as well as reduce the size of the imaging device, especially ones adapted to scan the larger 16-up format media plates.

As shown in FIG. 4, the internal drum 16 includes a photodetection device 40 and a pair of docking sensors 42, such as a strain gauge, a precision switch and a Hall effect device. The docking sensors are spaced laterally at the forward edge 44 of the internal drum 16 to provide a feedback signal of the location of the leading edge 46 of the media plate 14 for proper positioning on the drum.

Figure 5:
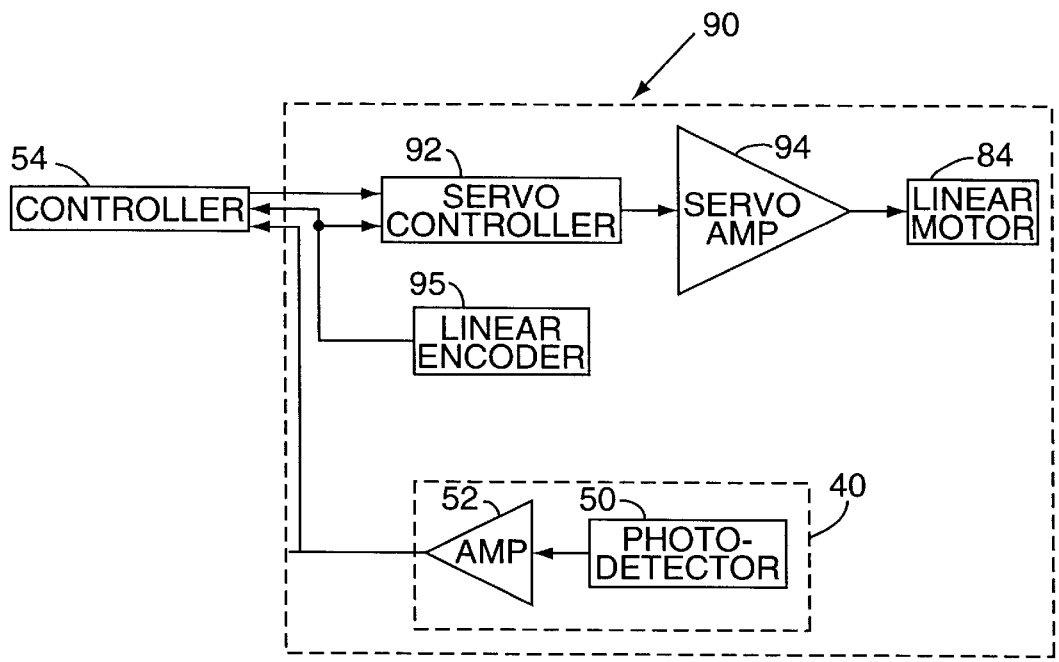
FIG. 5 is a schematic functional diagram of the linear motor drive system for the motion system of the imaging device of FIG. 1.

The photodetection device 40, similar to that disclosed in Applicants' co-pending U.S. patent application Ser. No. 08/844,250 filed Apr. 18, 1997 entitled "Multiple Beam Scanning System For An Imaging Device" (Attorney Docket No. I48-1076), incorporated herein by reference, is embedded below a mask or window 48 in the interior surface 32 of the internal drum 16 to sense the presence and light intensity of the modulated optical beam. Referring to FIG. 5, the photodetection device 40 includes a photodetector 50, such as a photodiode, and an electrical circuit 52 that amplifies the signal generated by the photodetector in response to detection of an optical beam. A controller 54 receives the amplified signal of the photodetector 50 and uses this feedback to locate the side edge 56 of the media plate 14, to calibrate the location of the optical beam reflected to the media plate in the fast scan and slow scan directions, and to calibrate the light intensity of the optical beam.

As best shown in FIG. 4, the mask 48 is disposed at a predetermined location from an outer edge 58 of the internal drum 16 so that a media plate 14, secured to the interior surface 32, overlaps a portion of the mask. It is important that the edges of the mask 48 are accurately disposed at known locations and orientations on the internal drum 16 for providing feedback to the controller 54 for calibrating the location of the optical beam on the internal drum.

Figure 9:
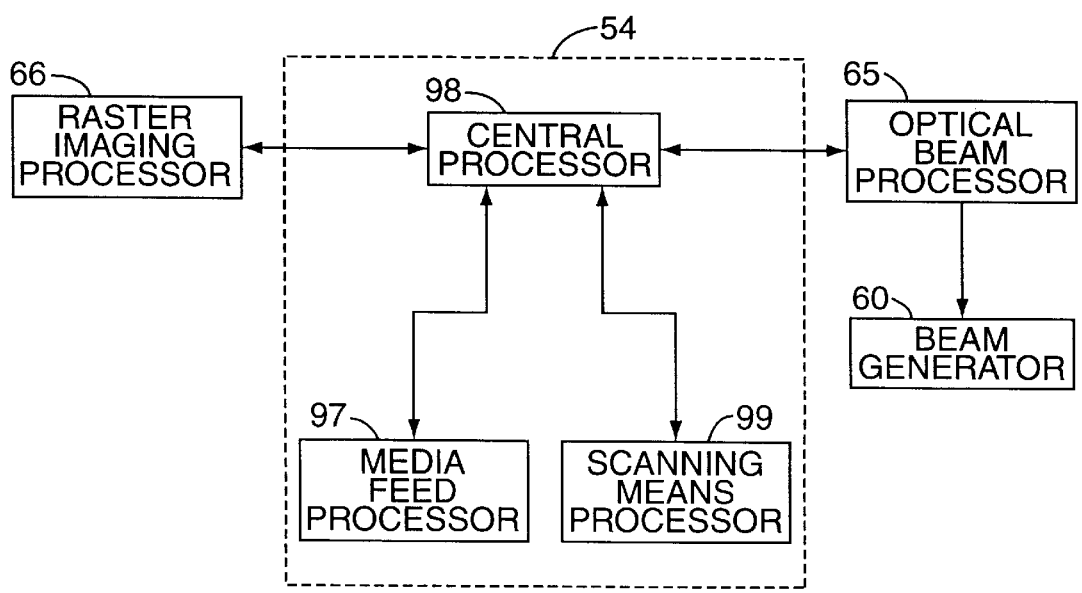
FIG. 9 is a schematic functional diagram of the control system of the imaging device of FIG. 1.

Referring to FIGS. 6 and 9, the photoplotter 10 further includes an optical beam generator 60, such as a laser diode, and beam forming optics 62 secured to a support structure 64 for directing a modulated optical beam emitted from the beam generator and through the beam forming optics coincidentally to the central axis z of the internal drum 16. The controller 54 provides, in response to digital signals of an image provided by a raster image processor 66, control signals to an optical beam processor 65 that provides imaging signals to the beam generator 60. The image is then reflected to the media by a scanning means 68 coupled to a spar 70 that extends above and parallel to the central axis z of the internal drum 16.

The scanning means 68 comprises a beam expander mechanism 72 and a spinner assembly 74 mounted to a carriage 76 suspended above the internal drum 16. The beam expander mechanism 72, similar to that disclosed in Applicants' co-pending U.S. patent application Ser. No. 08/674,439, entitled "Apparatus And Method For Positioning A Lens To Expand An Optical Beam Of An Imaging System" (Attorney Docket No. I48-1095) and incorporated herein by reference, includes a plurality of lens 78 secured to the carriage 76 for magnifying and focusing the optical feed beam onto the media plate 14. The spinner assembly 74 includes an off-axis parabolic mirror 80 mounted to a spinner motor 82 for causing the optical feed beam directed along the central axis z of the drum 16 through the beam expander mechanism 72 to be turned substantially orthogonal toward the interior surface 32 of the drum 16, focused on the emulsion coated surface of the media plate 14, and swept through a given arc across the surface in raster format. Each sweep of the beam across the media forms a scan line of a sequence of pixels. The rate of rotation of the parabolic mirror 80 is in the range of 12,000 to 24,000 rotations per minute.

Figure 8:
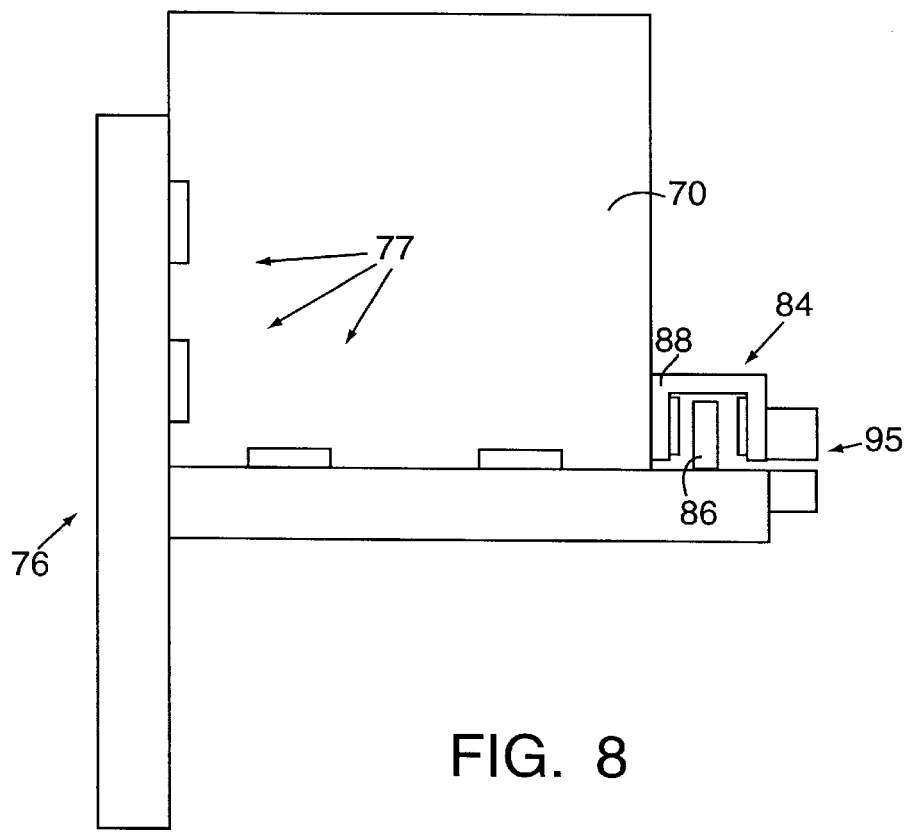
FIG. 8 is a side elevational view of the scanning means of the imaging device of FIG. 1.

As best shown in FIG. 8, the carriage 76 is coupled to the spar 70 by a magnetically preloaded air bearing system 77, similar to that disclosed in Applicants' co-pending U.S. patent application Ser. No. 08/674,763, entitled "Magnetically Preloaded Air Bearing Motion System For An Imaging Device" (Attorney Docket No. I48-1075) and incorporated herein by reference. The movement of the carriage 76 along the spar 70 is provided by a linear motor 84 mounted to the carriage 76 and spar 70. The linear motor 84 includes a coil assembly 86 and a magnetic track assembly 88. Referring to FIG. 5, the controller 54 provides motor control signals to a motor drive system 90 which provides the drive signal to the coil assembly 86 of the motor 84. The motor drive system 90 includes a servo controller 92, a servo amplifier 94, a linear scale or encoder 95, and the photodetection device 40.

The internal drum 16, scanning means 68, and optics support structure 64 are mounted atop a plurality of inflatable pads 96,96 (see FIG. 1) that are selectively inflated to level the drum.

As shown in FIG. 9, the controller 54 includes a media feed processor 97 that controls the operation of loading and docking of the media 14 onto the internal drum 16 and unloading the media to a conveyor in response to control signals provided by a central processor 98 and feedback signals received from the media feed apparatus 12, which will be described in greater detail hereinafter. The controller 54 further includes a scanning means processor 99 that controls the movement of the carriage 76, and operation of the spinner assembly 74 and beam expander mechanism 72 in response to feedback signals from the linear encoder 95 and the photodetector 40, and control signals provided by the central controller 98. The central controller monitors and synchronizes the operation of the RIP 66, the optical beam processor 65, the media feed processor 98 and the scanning means processor 99 in response to parameters provided by the operator and the processors in accordance with an algorithm provided by the present invention.

Turning now to the media feed apparatus 12, shown in FIGS. 1–3, the tracks 20,20, mounted to a support frame 22, are mechanically isolated from the scanning means 68, optical beam generator 60 and the internal drum 16. This mechanical isolation prevents vibration generated by the feed apparatus 12 from affecting the scanning of the media 14 while the feed apparatus continues the loading and unloading process of the media. The capability of simultaneously loading and scanning the media reduces the cycle time to load, scan and unload a prate of media.

As shown in FIG. 3, the rearward portion 100 of the tracks 20,20 preferably extend horizontally to the internal drum 16 at a height above the drum. The tracks then arc downwardly to the rearward edge 102 of the scanning surface 32 of the internal drum at 108 and extend along the outer edges 104 of the drum at 109. The tracks then extend upwardly and arc away from the forward edge 44 of the drum 16 at 108 to a forward portion 106 of the tracks that extend horizontally. The arcuate portions 108,109 of the tracks 20,20 are tangentially connected to provide a smooth transition therebetween. The radius p of the arcuate portions 108 of the tracks above the drum depend upon the flexibility of the media plates 14 and the necessary clearance x between the spar 70 and the internal drum 16. If the radii are too small, the media 14 may bend or pull away from the engagement means 24–26. If the radii are too great, the track 20 will extend too close to the spar 70 and not provide adequate clearance x for the engagement means to pass. In the preferred embodiment, the radius r of the arcuate portions 108,108 above the drum 16 are approximately 5 inches and the arcuate portions 109 about the outer edges 104 of the drum are approximately 13 inches.

Figure 10:
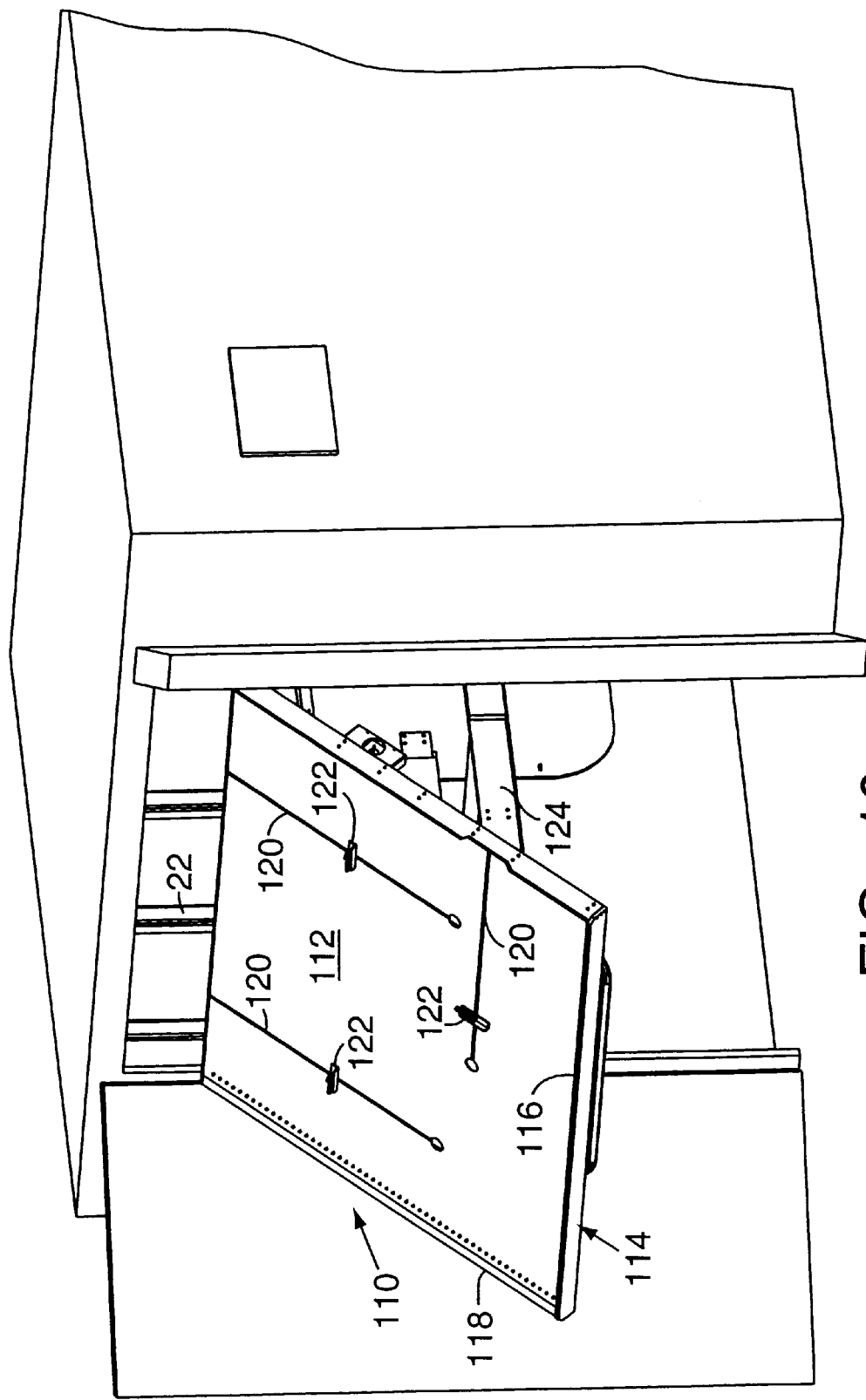
FIG. 10 is a perspective view of the tray of the imaging device of FIG. 1.

Referring to FIGS. 1 and 10, the feed apparatus 12 further includes a platform or tray 110 having a bottom surface 112 and walls 114 that extend upwardly about its perimeter. The tray 110 is disposed between the rearward portion 100 of the tracks 20,20 to support a single media plate or a stack of media plates for coupling with the media engagement means 24–26. The tray is oriented to hold the media substantially square relative to the scanning surface 32 of the internal drum 16 to reduce the adjustments necessary to properly position the media plate 14 onto the drum. The rearward wall 116 of the tray 110 is therefore oriented substantially perpendicular to the tracks and the side wall 118 is aligned with a zero reference point designated on the internal drum surface 32.

The bottom surface 112 of the tray 110 also includes a plurality of slots 120,120 for slidably receiving a corresponding number of clamping means 122,122 adapted to engage the edges of the media 14 and maintain the media square to the side wall 118 and rearward wall 116 of the tray. The slots permit the clamps to be adjusted to accommodate media plates of various dimensions.

As shown in FIG. 10, the tray 110 is pivotally mounted to a tray support 124 that is slidably supported, such as by rollers, to the frame structure 22 to enable the tray to be pulled back clear of the tracks 20,20 and tilted upwardly to provide an inclined surface for receiving the media plates. The operator raises and lowers the tray by actuating a pneumatic piston (not shown) attached between the tray support 124 and the bottom surface of the tray.

Figure 11:
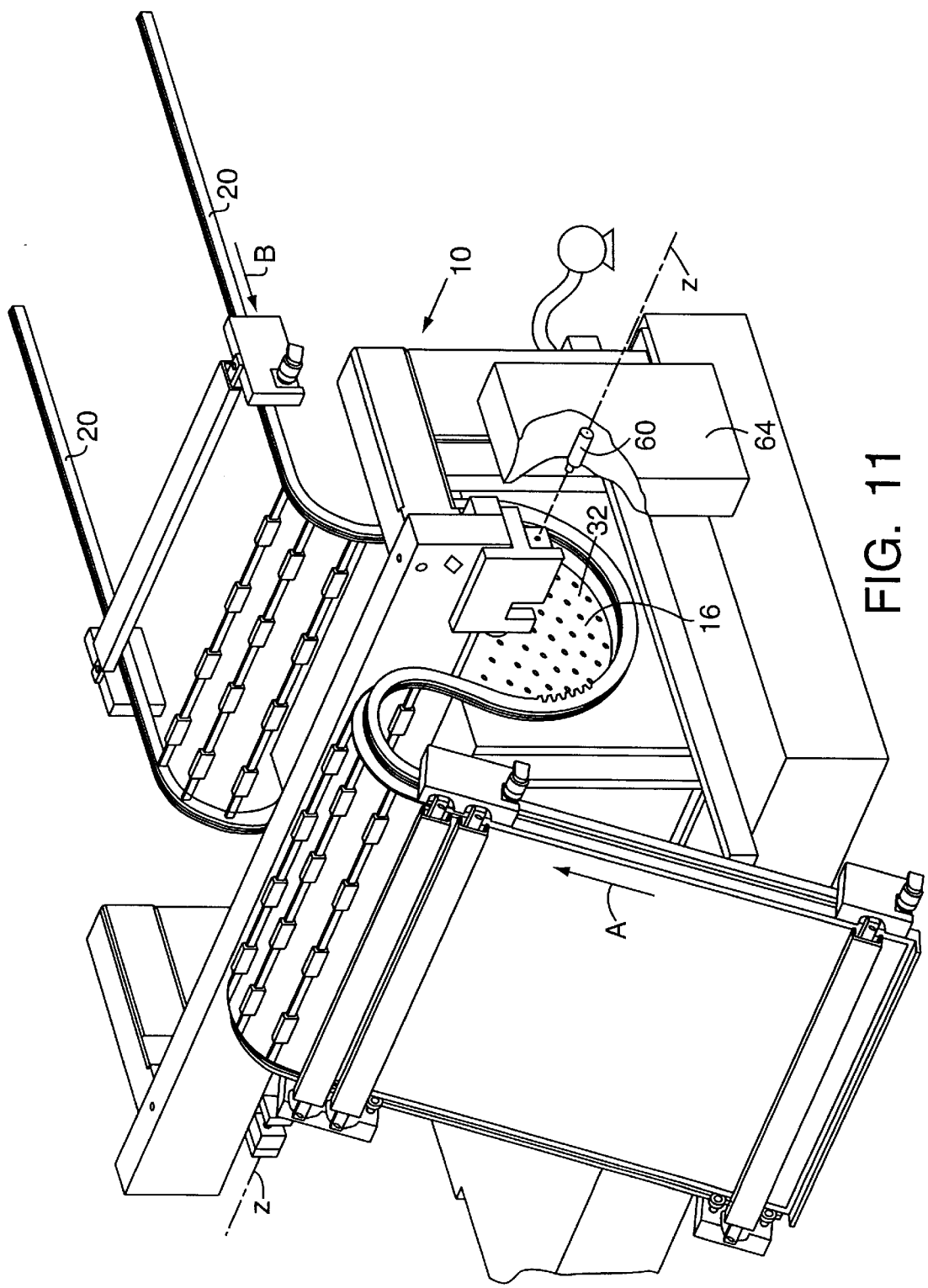
FIG. 11 is a perspective view of an alternative embodiment of the media feed apparatus provided in accordance with the present invention.

In an alternative embodiment as shown in FIG. 11, the tray 110 may be fixedly supported between the rearward portion 100 of the tracks 20,20 that extend from the ground surface and incline linearly upward to a point above the internal drum 16. The media plates 14 are loaded onto the tray by advancing the engagement means 24,25 clear of the tray and fitting the plates between the tracks 20,20 and onto the tray and clamping the media therein.

Referring to FIG. 2, the feed apparatus 12 further includes a plurality of media support means 126,126 circumferentially-spaced between the arcuate portions 108, 108 of the tracks 20,20 disposed above the drum 16. FIG. 2 only shows the media support means 126 disposed at the rearward portion of the drum with the understanding that a second media support means 126 is disposed at the forward portion of the drum. Each media support means 126 includes a plurality of rollers 128, formed of polyethylene foam, disposed along an axle 130.

As best shown in FIG. 2, the feed apparatus 12 includes a plate deflector 130 for preventing damage to the scanning means 68, air bearing system 77 and media plate as the scanned media plate 14 is removed from the internal drum 16 by the forward engagement means 26. The plate deflector 130 comprises a plurality of rollers 132,132 laterally-spaced along rods 134,134 that are vertically-spaced between two arcuate plates 136,136. The curvature of the arcuate plates are complementary to the curvature of the arcuate portion 108 of the tracks 20,20 disposed above the drum.

Each arcuate plate 136 is movably attached to the support frame 70 by a pair downwardly extending support members 137,137. Each support member 137 includes a slot 139 for receiving a guide pin 140 that extends outwardly from the arcuate plates 136 for guiding the deflector 130 into the exposure chamber 34. Vertical movement of the deflector into and out from the drum is provided by a pair of pneumatic pistons 138,138. In the retracted state, the plate deflector 130 is disposed above the internal drum 16 between the linear scale 95 and the forward edge 44 of the drum 16. The controller 54 provides control signals to actuate the pistons 138,138 to raise and lower the plate deflector into and out from the internal drum. When the media 14 is being scanned or the forward engagement means 26 is disposed within the drum 16, the plate deflector 130 is commanded to the retracted position. When the forward engagement means 26 is pulling the media plate 14 out from the drum, the plate deflector 130 is lowered sufficiently into the internal drum to deflect and guide the trailing edge of the media plate away from the linear scale 95 and spar 70.

Figure 12:
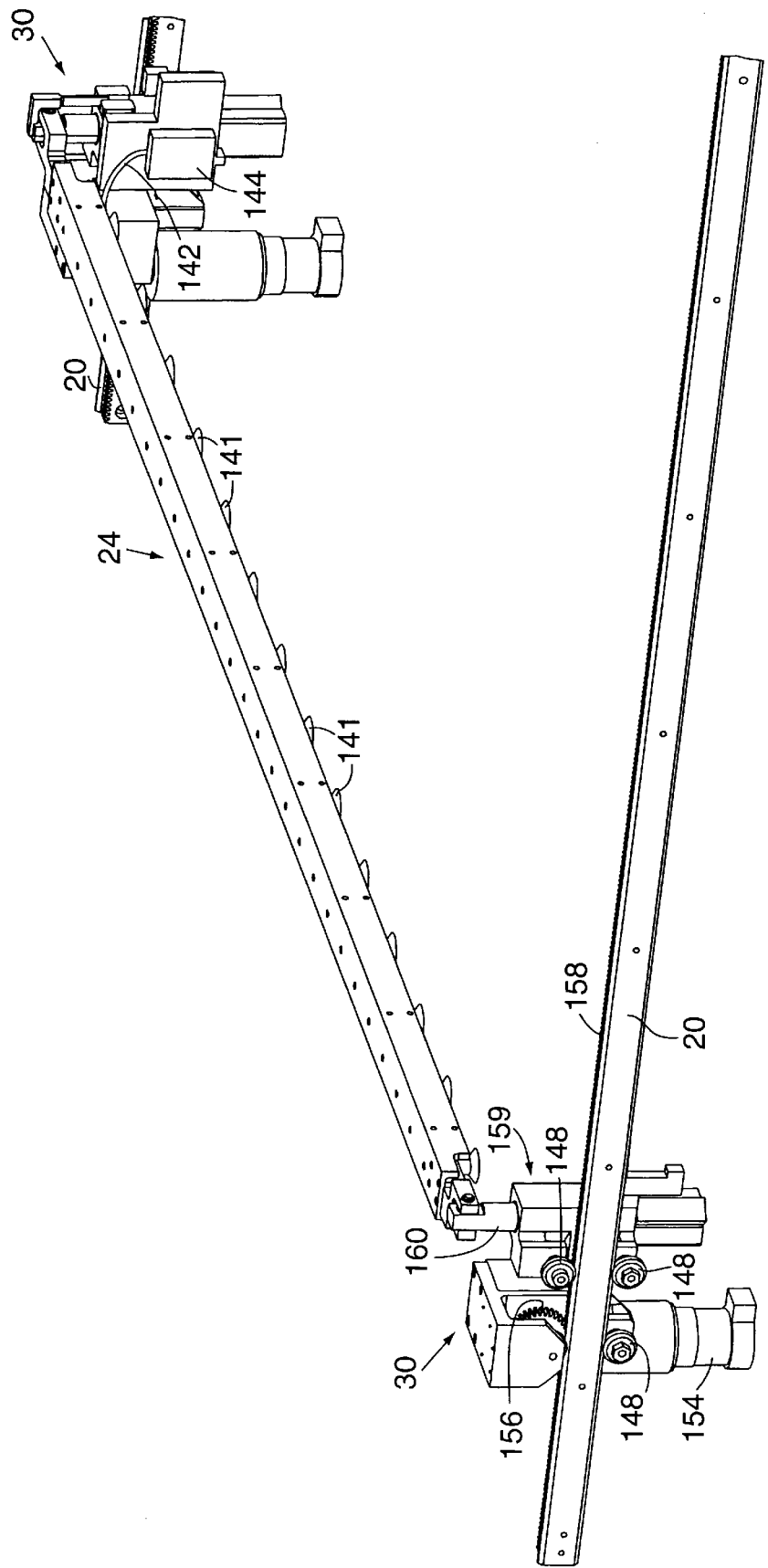
FIG. 12 is an expanded, perspective view of the engagement means of the media feed apparatus of the imaging device of FIG. 1.
Figure 13:
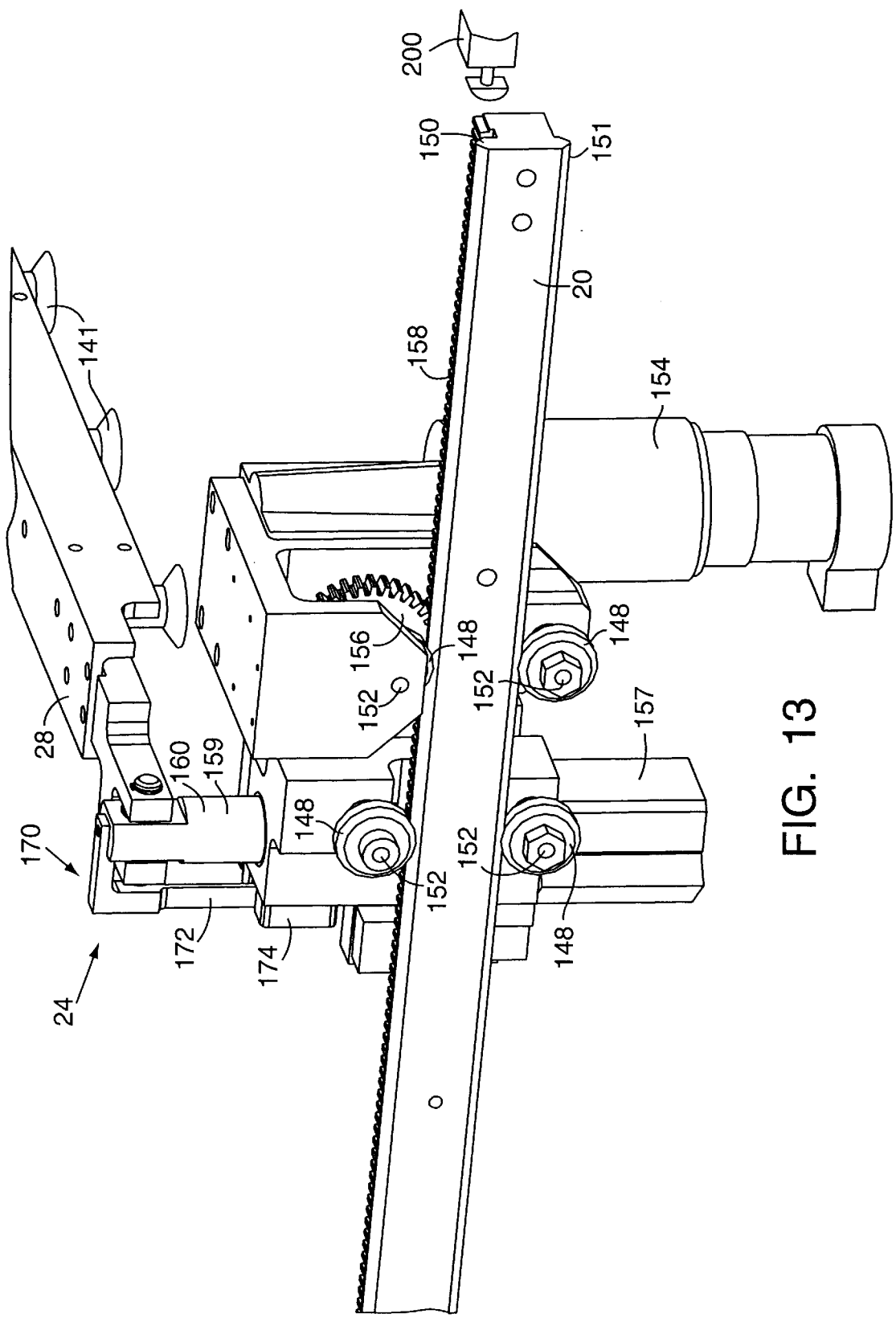
FIG. 13 is an outer expanded, perspective view of a drive assembly of an engagement means of the imaging device of FIG. 1.
Figure 14:
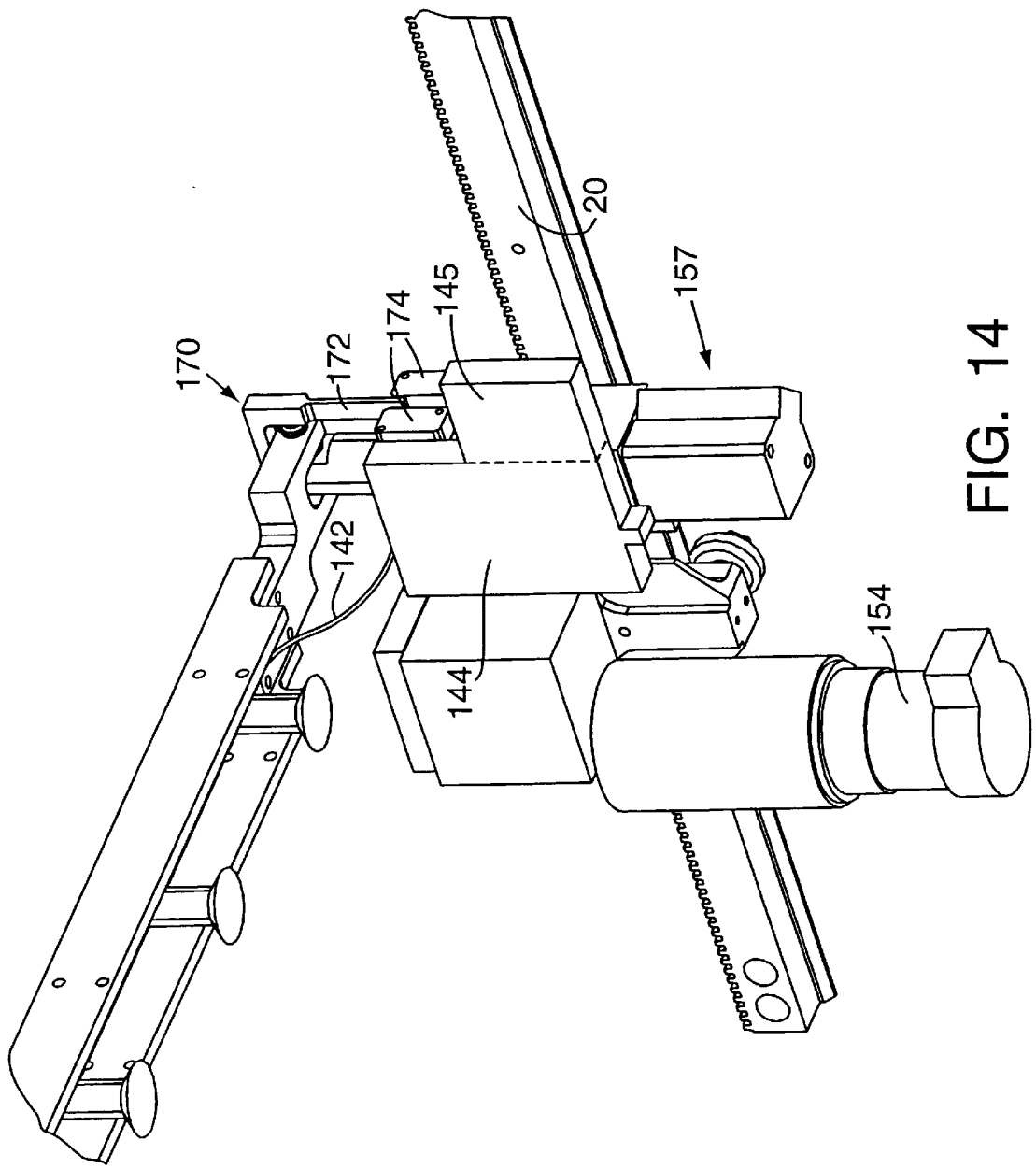
FIG. 14 is an inner expanded, perspective view of a drive assembly of an engagement means of the imaging device of FIG. 1.

Referring to FIGS. 12–14, the media plates 14 are releasably secured to the rails 28,28 of the engagement means 24–26 by a plurality of suction cups 141, mounted within orifices disposed along the length of the bottom surface of the rails. The cups 141 of the rails 28,28 of the engagement means 24–26 are disposed in a single row approximately four inches apart.

Figure 15:
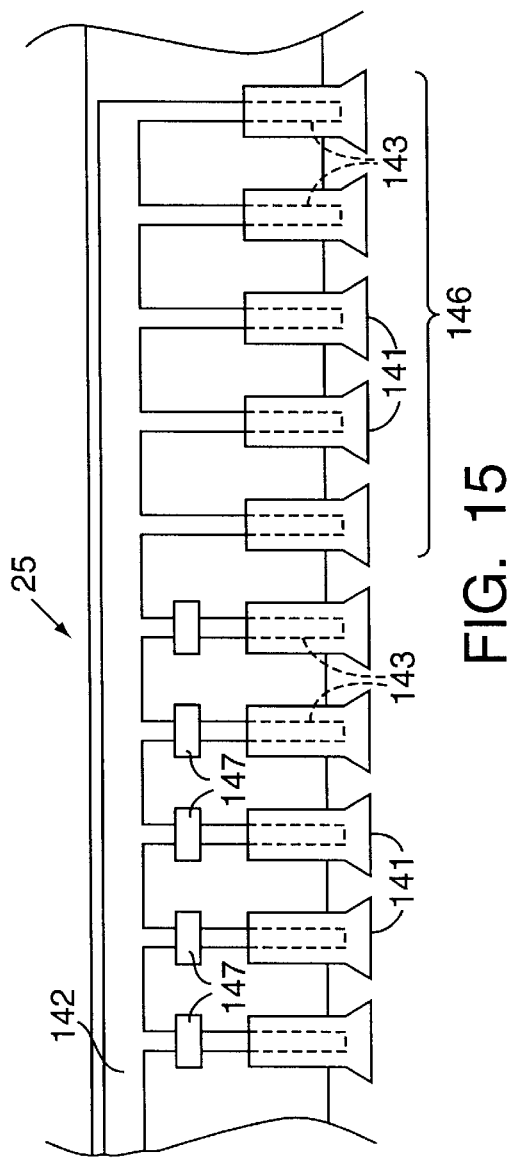
FIG. 15 is a forward elevational view of a portion of the rail of an engagement means of the imaging device of FIG. 1, shown partially broken away.

The cups 141 of each row, as shown in FIG. 15, are interconnected by a central tubing 142 which provides vacuum pressure to each cup through a centrally-disposed orifice 143. Vacuum pressure is generated by individual vacuum pumps 144 (see FIG. 14) mounted to a respective drive assembly 30. Each vacuum pump includes a vacuum sensor 145 that provides a vacuum signal to the controller 54 representative of the presence of sufficient vacuum pressure.

Figure 7:
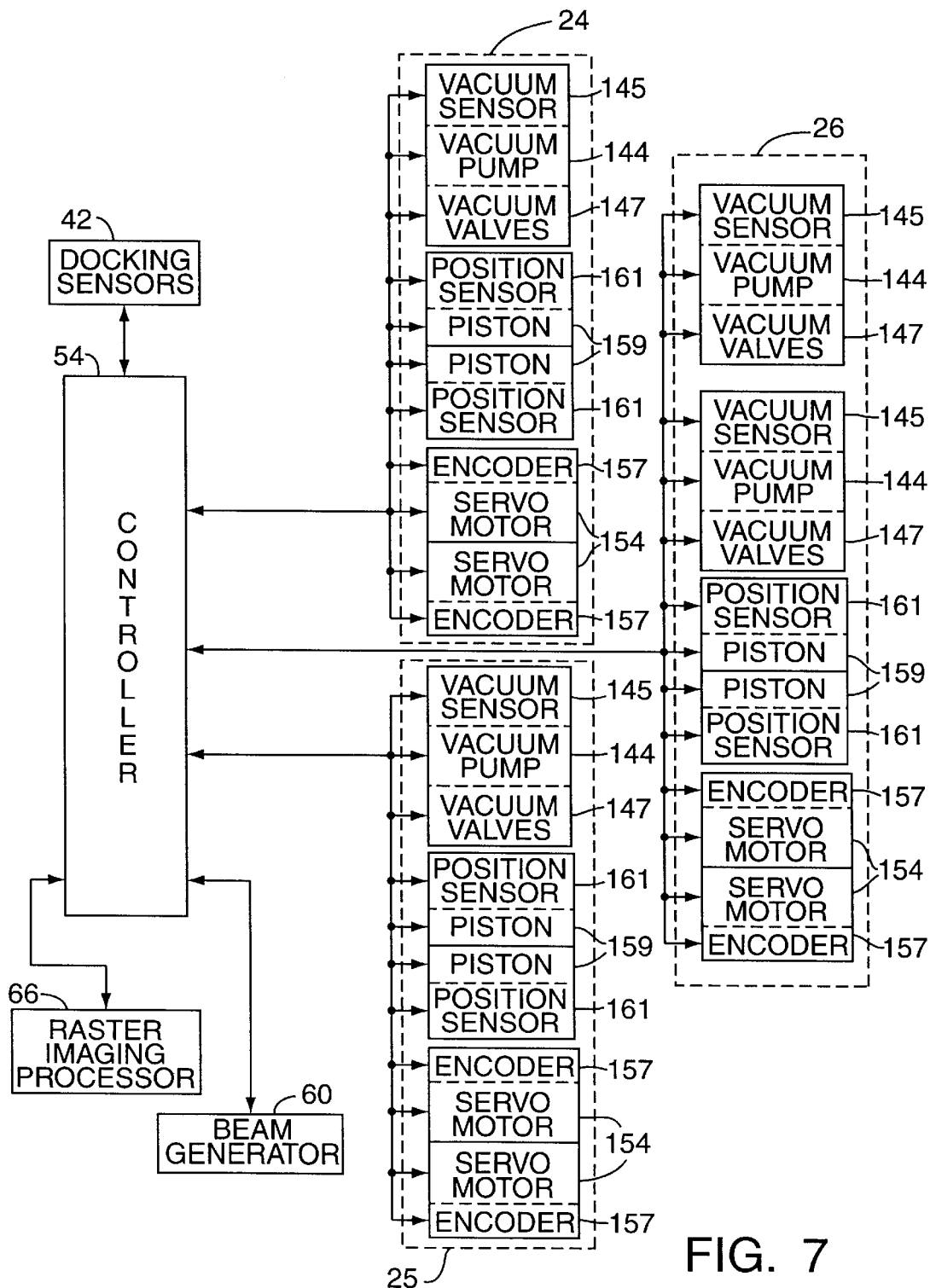
FIG. 7 is a schematic functional diagram of the media feed control system of the imaging device of FIG. 1.

Each of the cups are interconnected in parallel the central tubing 142. A predetermined number of adjacent cups 146 are in direct fluid communication with the central tubing 142 such that when the respective vacuum pump 144 is actuated, vacuum pressure is always applied to the cups. This predetermined group of adjacent cups 146 is dependent upon the width of the smallest media plate expected to be imaged. Each of the remaining cups are in fluid communication with the central tubing 142 through a vacuum valve 147. Each vacuum valve 147 provides vacuum pressure to each respective cup in response to an actuation signal provided by the controller 54 shown in FIG. 7. The controller actuates the appropriate numbers of vacuum valves 147 of the cups adjacent to the directly coupled cups 146 to insure that only the cups engaging the media plate has vacuum pressure. Furthermore, the controller 54 independently provides signals to each vacuum pump 144 to selectively actuate each vacuum pump.

Referring to FIGS. 12 and 13, each drive assembly 30,30 includes two pairs of sheaves 148 having a V-shaped groove adapted to receive the upper and lower edges 150,151 of the tracks 20,20 having a complementary V-shape. One pair of sheaves are arranged to engage the upper edge 150 of the tracks 20,20 and the other pair are arranged to engage the lower edge 151 of the tracks. The sheaves 148,148 freely rotate about a pin 152 to ensure smooth movement of the drive assembly 30 along the tracks.

Each drive assembly 30 further includes a servo motor 154 driven independently by the controller 54 (See FIG. 7) for advancing the rails 28,28 along the tracks 20,20. Independent control of the drive assemblies permit the controller to position the media plate 14 squarely on the drum 16. A sprocket or pinion gear 156 is attached to the shaft of each of the servo motors 154. The sprocket or pinion gear engages a chain or rack gear 158 that is mounted along or integral with the inner surface of the tracks 20,20, as shown in FIG. 13. As the motor 154 rotates the pinion gear 156, the engagement means 24 moves along the tracks 20,20. The servo motors are driven in the closed loop mode. The servo motors include an encoder 157 (see FIG. 7) which provides a feedback signal to the controller 54 that is indicative of their position along the tracks to provide accurate movement of the drive assemblies 24–26.

Referring to FIGS. 12 and 13, the ends of each rail 28,28 are pivotally attached to a pneumatic piston or solenoid 158 to actuate a plunger 160 that independently raises and lowers the ends of the rails. The rails 28,28 are lowered to engage the media plate 14 and raised to lift the media off the tray 110 and transport the media to the internal drum 16. The pneumatic pistons are independently controlled by the controller 54 (See FIG. 7) to permit media to be lifted one corner at a time. The pistons further include a position sensor 161 that provides feedback to the controller representative of the plunger's position.

Figure 16:
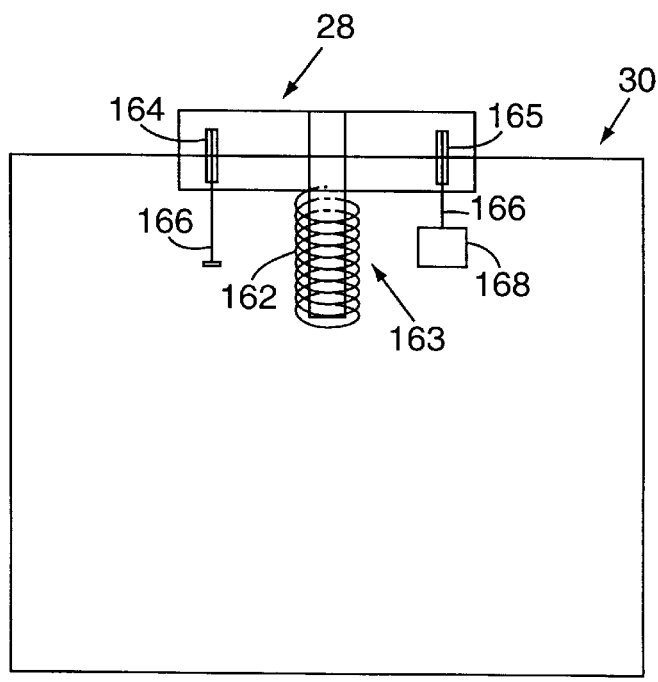
FIG. 16 is an outer side elevational view of a second alternative embodiment of the drive assembly provided in accordance with the present invention.

In an alternative embodiment shown in FIG. 16, a lifting means 161 of the engagement means 24–26 includes a spring 162 disposed at each end of the rail 28,28 to bias the rail upward. One end of the spring 162 connects to the drive assembly 30 and the other end engages the rail 28. The springs urge the ends of the rail upward to lift the media plate 14 off of the tray 110 and internal drum 16.

Each lifting means further includes pulleys 164,165, a cable 166 and an actuator 168 for lowering the rail 28 to engage the media 14 with the cups 141. A pair of pulleys 164,165 are disposed at the forward and rearward edge of both ends of the rail. The actuator 168 is mounted to one drive assembly 30 and another pair of pulleys 164 are disposed in the other drive assembly 30. The cable 166 is strung from the actuator 168 through the pulleys 164 disposed along the forward edge of the rail 28, through the pulleys 165 disposed in the other drive assembly 30 and back to the drive assembly through the pulleys 165 along the rearward edge of the rail 28. When the rail is lowered, the controller 54 provides a signal to the actuator 168 which applies tension to the cable 166 sufficient to overcome the force of the springs 162,162, resulting in the rail lowering a predetermined distance. The rail is raised by simply de-energizing the actuator and releasing the tension of the cable, resulting in the spring urging the rail upward.

Referring to FIGS. 13 and 14, one drive assembly 30 of each engagement means 24–26 includes a skew limit switch 170 that provides a error signal to the controller 54 when the angle of the rail 28, relative to the tracks 20,20, deviates a predetermined value from 90 degrees. In other words, the skew limit switch 170 provides an error signal whenever one of the drive assemblies of an engagement means travels further along the track than the other opposing drive assembly.

The skew limit switch 170 comprises a wiper 172 that extends downwardly between a pair of laterally-spaced contact switches 174,174. One end of the wiper is attached to the end of plunger 160 of the piston 158. The space between the contact switches 174 define the limits of skew angle of the rail 28. When the rail skews in one direction, the wiper 172 pivots about the end of the rail and contacts one of the contact switches, which provides an error signal to the controller 54. If the rail skews in the other direction, the wiper pivots and contacts the other contact switch. The contact switches 174,174, in response to contact by the wiper, provide an error signal to the controller 54 which then removes the drive signals from the respective drive assemblies 30,30 and provides a fault indication to the operator.

Figure 17:
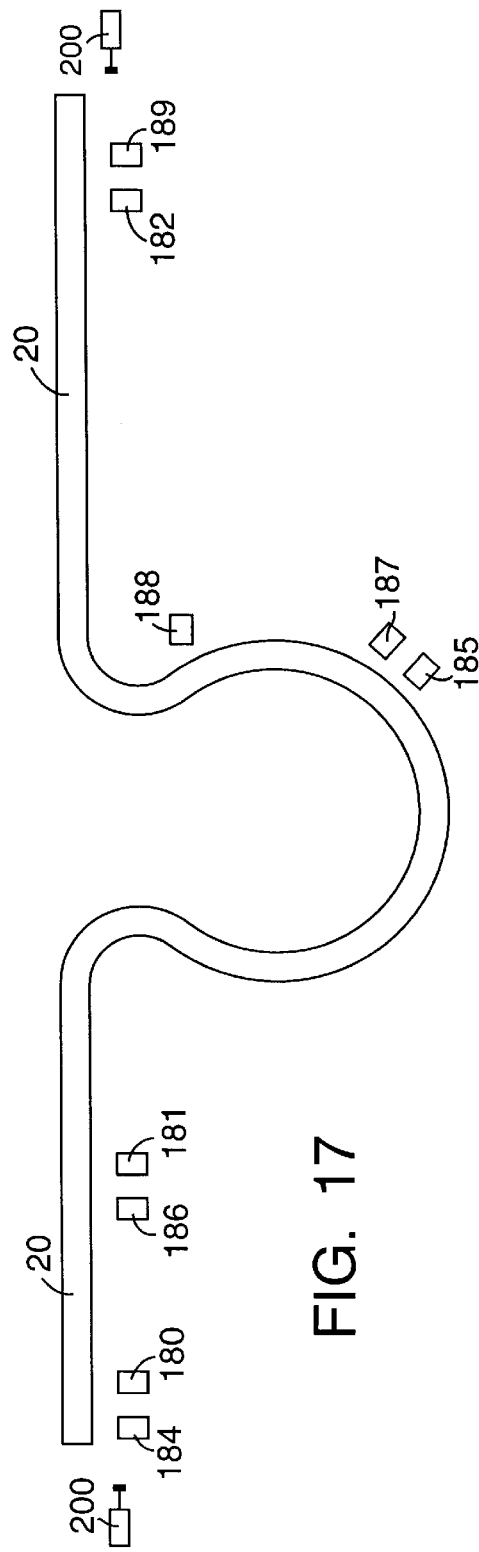
FIG. 17 is a side elevational view of the tracks, limit sensors and home position sensors of the media feed apparatus of the imaging device of FIG. 1.

Referring to FIG. 17, the media feed apparatus 12 includes home position sensors 180–182 disposed at predetermined locations along the tracks 20,20 to provide a home signal to the controller 54 when a corresponding drive assembly 30 is located at its home position. The home position sensor 180 of the rearward engagement means 24 is towards the rearward end of the tracks 20,20 above the trailing edge of the media 14 disposed in the tray 110. The home position sensor 181 of the intermediate engagement means 25 is located at the rearward end of the tracks above the leading edge of media plate 14. The home position sensor 182 of the forward engagement means 26 is located at the forward end of the tracks 20,20.

The media feed apparatus 12 further includes a pair of travel limit sensors for each engagement means 24–26 that provide a limit signal to the controller 54 when a corresponding drive assembly 30 is located at its travel limit positions along the tracks 20,20. The controller, in response to the limit signal, removes the drive signal from the corresponding drive assemblies 30,30 to prevent further advancement along the tracks and damage to the cabling attached to the engagement means. The rear travel limit sensor 184 for the rearward engagement means 24 is located a few inches before its home position sensor 180. The forward travel limit sensor 185 of the rearward engagement means 24 is located approximately two-thirds about the internal drum 16. The rear travel limit sensor 186 for the intermediate engagement means 25 is located a few inches before its home sensor 181. The forward travel limit sensor 187 of the rearward engagement means is located at the forward edge 44 of the internal drum 16. The rear travel limit sensor 188 for the forward engagement means 26 is located before the forward edge 44 of the internal drum 16 and after the forward limit sensor 185 of the rearward engagement means 24. The forward travel limit sensor 189 of the forward engagement means 26 is located a few inches after its home position.

Figure 18:
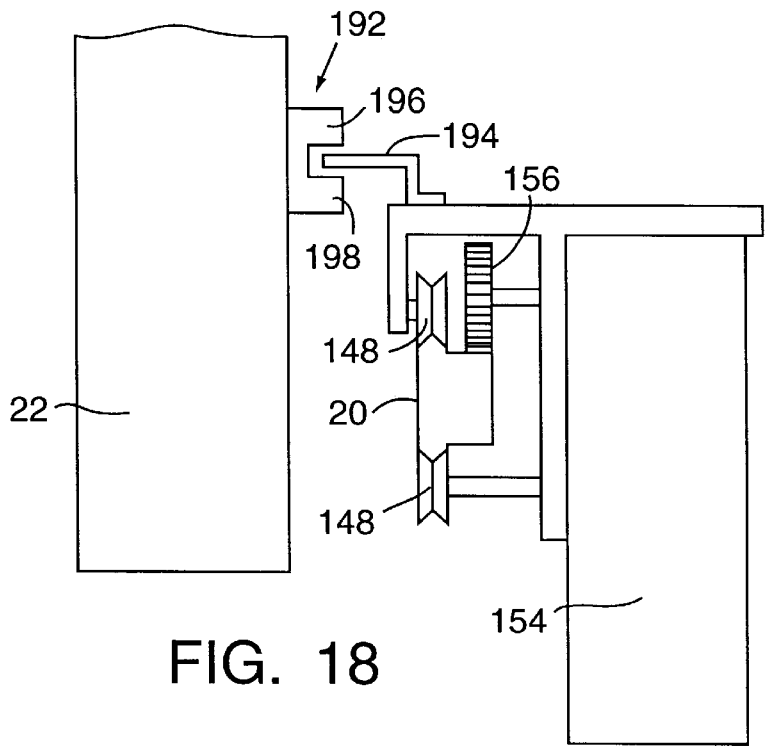
FIG. 18 is an expanded, side elevational view of a drive assembly of an engagement means of the imaging device of FIG. 1.

As shown in FIG. 18, the home position sensors 180–182 and travel limit sensors 184–189 include a sensing element 192 and a plate 194. The sensing elements 192 are mounted to the supporting frame 22 at the home and travel limit positions of the drive assemblies 30,30 and the plates 194 are secured to the drive assemblies 30,30.

The sensing elements 192 includes two members 196,198 that extend outwardly from the supporting frame 22. One member 196 includes a light emitting diode (LED) and the second member 198 includes a photosensitive element for receiving the light emitted from the LED. The sensing element 192 provides a signal to the controller 54 representative of whether the photosensitive element is receiving light from the LED or not. The plate 194, mounted to the drive assembly 30, passes between the members 196,198 of the sensing element 192. When the drive assembly is moved to the home position, the plate blocks the light emitted from the LED, resulting in an open signal provided by the sensing element to the controller 54, indicating that the drive assembly is at the home or travel limit positions.

In an alternative embodiment, the sensing elements 192 may include a Hall Effect sensor (not shown) mounted to the drive assembly 30 and a magnetic element mounted to the supporting frame 22 or the outer surface of the tracks 20,20 at the home or travel limit positions.

Referring to FIG. 13, the media feed apparatus 12 includes hard mechanical stops 200 mounted to the ends of the tracks 20,20. The mechanical stops prevent the cars 30,30 of the engagement means 24,26 from advancing off the ends of the tracks should a catastrophic error occur. In the alternative, the mechanical stops may be spring-loaded.

Figure 19:
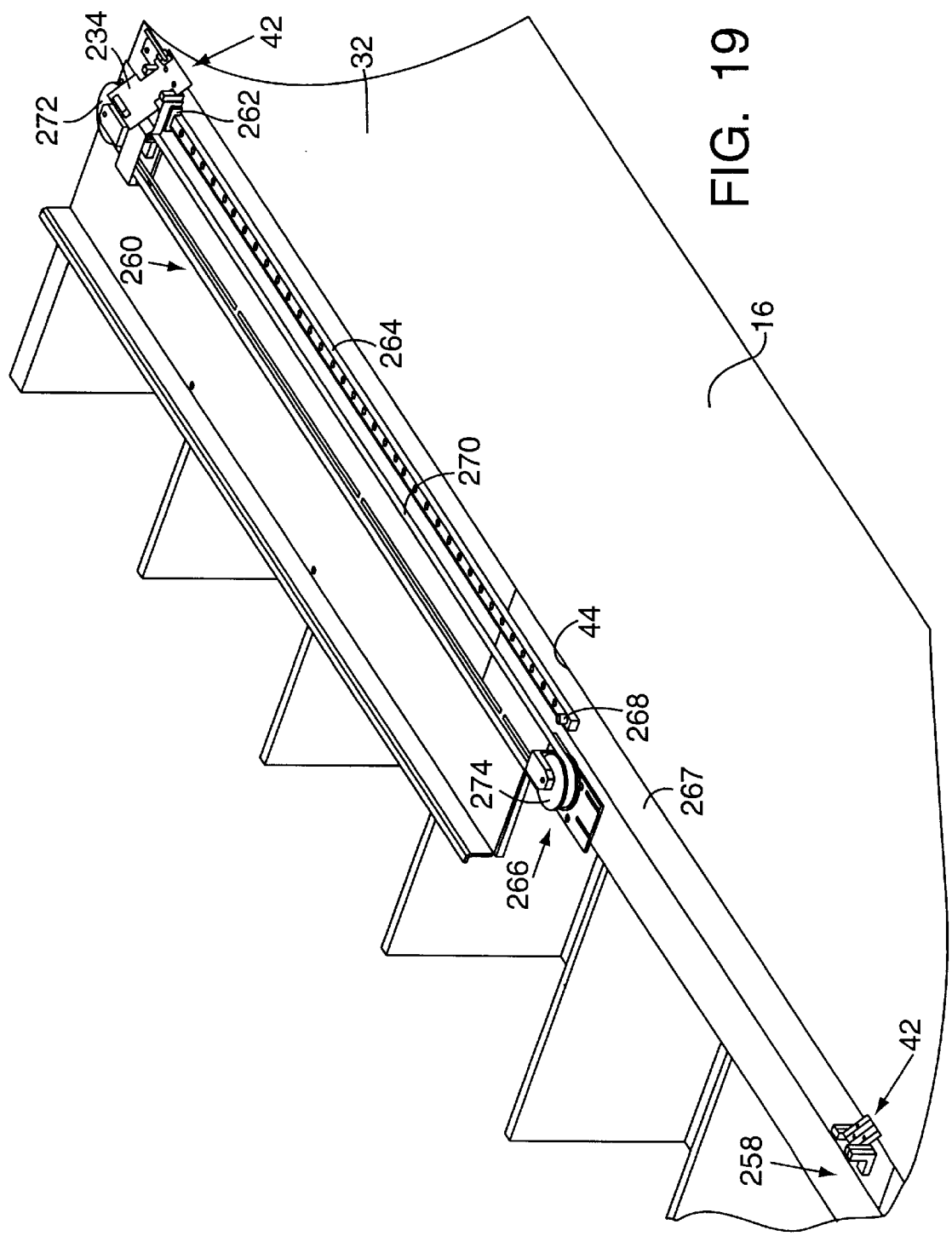
FIG. 19 is a perspective view of a pair of docking sensors and the internal drum partially broken away of an imaging device of FIG. 1.

Referring to FIG. 19, the docking sensors 42,42 are spaced axially on the forward edge 44 of the internal drum 16 for contacting the ends of the leading edge of the media 14. When the media contacts the docking sensors 42,42, the sensors provide docking signals to the controller 54 representative of the position of the media on the internal drum 16. The controller 54, in response to the received docking signals, provides signals to the motor drive assemblies 30,30 of the engagement means 24–26 to adjust the media 14 on the drum to a desired position. The positioning of the media on the drum will be described in greater detail hereinafter.

Figure 20:
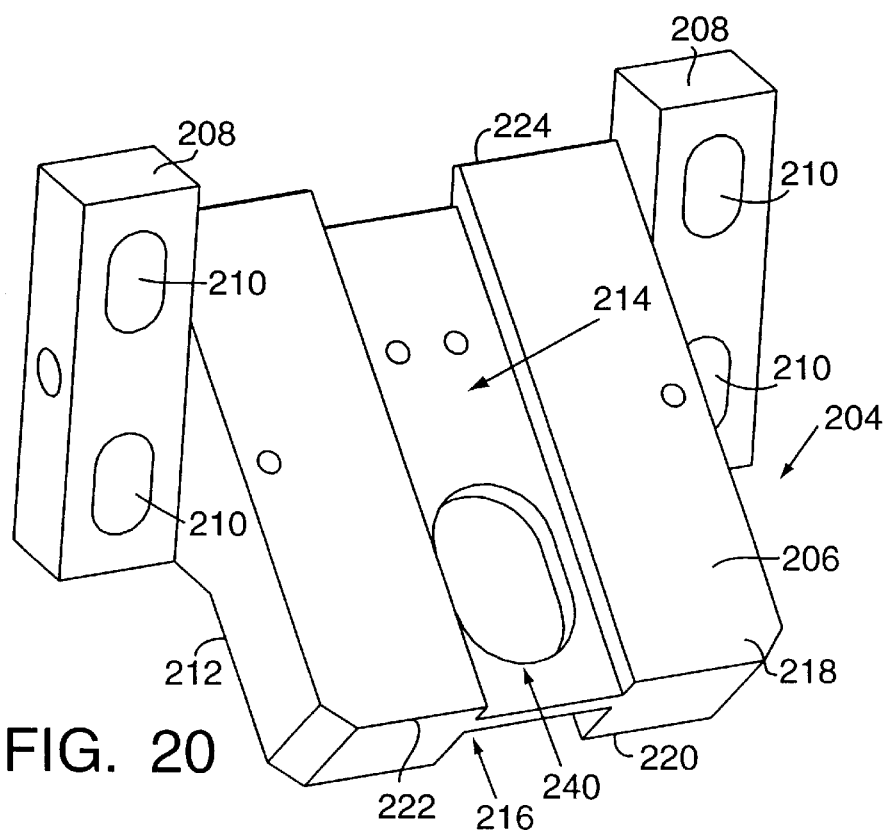
FIG. 20 is an expanded, perspective view of the frame of a docking sensor of the imaging device of FIG. 1.
Figure 21:
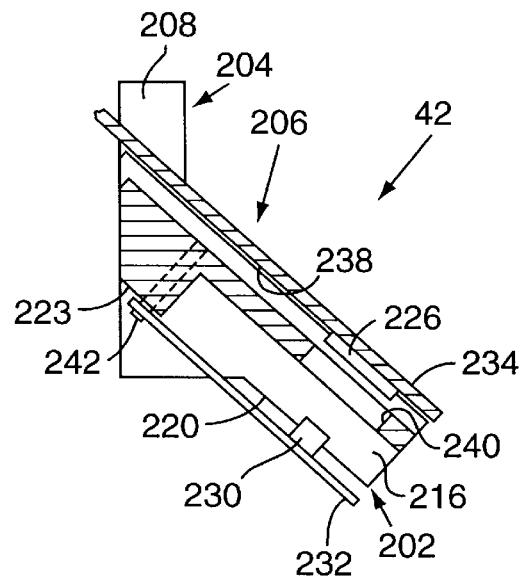
FIG. 21 is a cross-sectional view of the docking sensor of FIG. 23 taken along the lines of 21—21.

FIGS. 19–21 illustrate a preferred embodiment of a docking sensor 42 that includes a Hall Effect device 202 secured to a non-magnetic frame 204. The frame includes a mounting member 206 disposed between a pair of vertical flanges 208,208. Each flange 208 includes a pair for vertically spaced holes 210,210 for attachment to a bracket or carriage. The mounting member 206 extends downwardly from the flanges at an obtuse angle of approximately 130 degrees such that the bottom surface 212 of the mounting member projects radially from the surface 32 of the internal drum 16. A pair of opposing grooves 214,216 in the upper and lower surface 218,220 respectively, of the mounting member extend from the forward edge 222 to the rearward edge 224 of the mounting member for receiving the Hall Effect device 202. The groove 214 disposed in the lower surface 220 of the mounting member includes a step 224 at its rearward portion.

Figure 22:
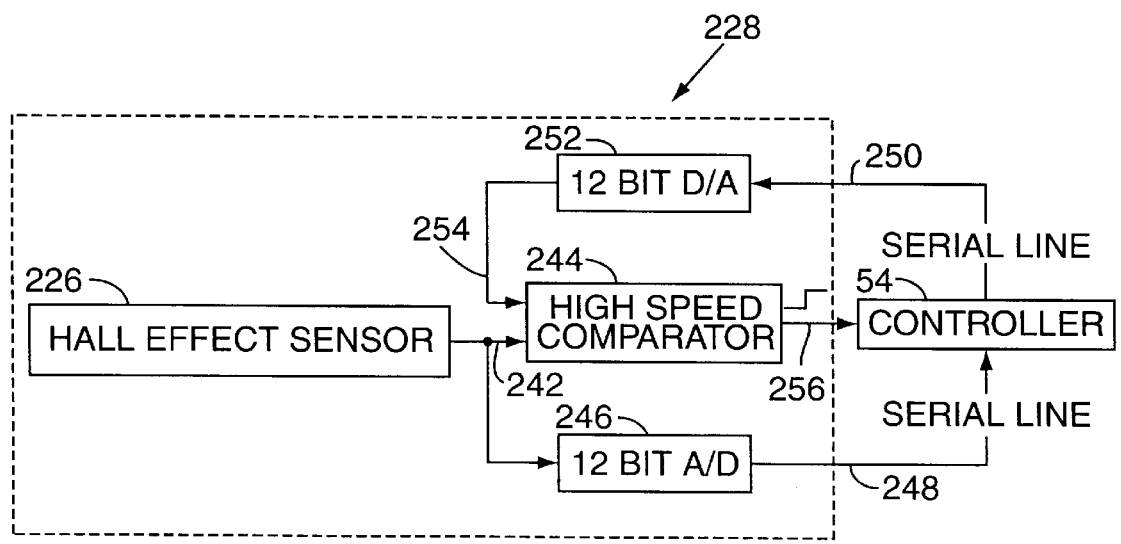
FIG. 22 is a schematic functional diagram of the docking sensor assembly of the imaging device of FIG. 1.

As shown in FIGS. 21 and 22, the Hall Effect device 202 includes a Hall Effect transducer (HET) 226, electrically connected to a comparator circuit 228, and a magnet 230, mounted to the top surface of a leaf spring 232 at its outer end. The HET 226 senses the change in the electromagnetic field generated by the magnet 230. When the leaf spring 232 is contacted by the leading edge of the media plate 14, the leaf spring deflects towards the HET 226 which provides a linear output voltage representative of the degree of deflection of the leaf spring and magnet 230. In the alternative the HET and the magnet may be substituted by sensor capable of sensing a physical or electromagnetic field change that is proportional to the position of the media, such as a capacitive proximity sensor, an inductive proximity sensor, and a GMR.

The HET 226 and the comparator circuit 228 are mounted to a circuit board 234 that is secured to the upper surface 218 of the mounting member 206 of the frame 204 by a pair of fastening means 236. The HET is mounted to the bottom surface 238 of the circuit board and is received by the upper groove 214 of the mounting member and is aligned with the opening 240 between the upper and lower grooves.

The leaf spring 232 is secured at its inner end to the bottom surface of the step 224 disposed in the lower groove 216 by a pair of fasteners 242 secured in bores. The bottom surface of the step 224 is parallel to and extends below the lower surface 220 of the mounting member 206 approximately 0.030 inches to enable the leading edge of the media 14 to contact and flex the leaf spring. The leaf spring is preferably formed of non-magnetic material, such as beryllium copper alloy (No. 172), that has a high fatigue life, is temperature stable and is non-deforming.

The magnet 230 is arranged on the leaf spring 232 to extend into the lower groove 216 and align with the opening 240 disposed between the upper and lower grooves 214,216. The magnet is attached on the leaf spring with its poles oriented in the direction of movement of the leaf spring. This orientation enables the HET 226 to detect small changes in the location of the magnet because the magnetic gradient is greatest at the poles.

Referring to FIG. 22, the output signal of the HET 226 is provided to the comparator circuit 228. Specifically, the output signal of the HET is provided to an input 242 of a comparator 244 and a 12 bit analog/digital (A/D) converter 246. The output signal of the A/D converter 246 is provided via a serial line 248 to the controller 54. The controller provides a 12 bit reference signal via a serial line 250 to a 12 bit digital/analog (D/A) converter 252. The 12 bit reference signal is representative of the desired position of the media plate 14 at the point of contact at each docking sensor 42. The D/A converter 252 generates an analog signal representative of the 12 bit reference signal that is provided to a second input 254 of the comparator 244. The comparator 244 generates an output signal representative of the difference between the two input signals. The output signal is provided to the controller 54 through line 256. The controller 54 processes the information to provide an error signal to the drive circuit of the servo motor 154 of the drive assemblies 30,30.

If the output signal of the HET 226 at 242 is less than the output signal of the D/A converter 252 at 254, the comparator provides a low signal (approximately zero volts) that indicates the media plate has not reached the desired position. If the output signal of the HET at 242 is equal to or greater than the output signal of the D/A converter at 254, the comparator 244 provides a high signal that indicates the media plate has at least reached the desired position. The controller 54 records the position of the drive assemblies 30,30 of the engagement means 25,26 provided by the encoder 157, in response to the rising edge of the output signal of the comparator.

In the alternative, the comparator 244 may include hysteresis that provides a square wave output signal representative of the range between a minimum and maximum desired position of the media plate 14. The minimum position is representative of the rising edge of the waveform and the falling edge of the waveform is representative of the maximum position.

In a preferred embodiment shown in FIG. 19, one docking sensor 42 is fixedly disposed at one end 258 of the internal drum 16 for engagement with one end of the leading edge of the media 14. The other docking sensor 42 is secured to a drive mechanism 260 for variably positioning the docking sensor along the forward edge 44 of the internal drum to accommodate media plates of varying widths.

The drive mechanism 260 includes a sensor carriage 262, a guide strip 264 and a belt drive assembly 266. The sensor carriage 262 slidably engages the guide strip 264 that is mounted axially on the end surface 266 of the internal drum 16 and parallel to its forward edge 44. The guide strip is set back from the edge of the internal drum a predetermined distance so that a portion of the docking sensor 42 extends over the surface 32 of the internal drum. The guide strip extends a length of the internal drum to enable the docking sensor 42 to be positioned to contact the edge of any size media plate 14. The guide strip also includes a hard stop 268 at each end to prevent the carriage 262 from advancing off of the guide strip.

The sensor carriage 262 and docking sensor 42 are moved along the guide strip 264 by the belt drive assembly 266 that includes a belt 270 looped about a pair of pulleys or sheaves 272,274 laterally-spaced apart along the forward edge 44 of the internal drum 16. One pulley 272 is mounted to the internal drum to freely rotate and the other pulley 274 is driven by a stepper motor (not shown) for advancing the belt 270 axially along the edge of the internal drum. The controller 54 provides a drive signal to the stepper motor to move the sensor carriage and docking sensor according to the width of the media plate 14 to be scanned.

Figure 23:
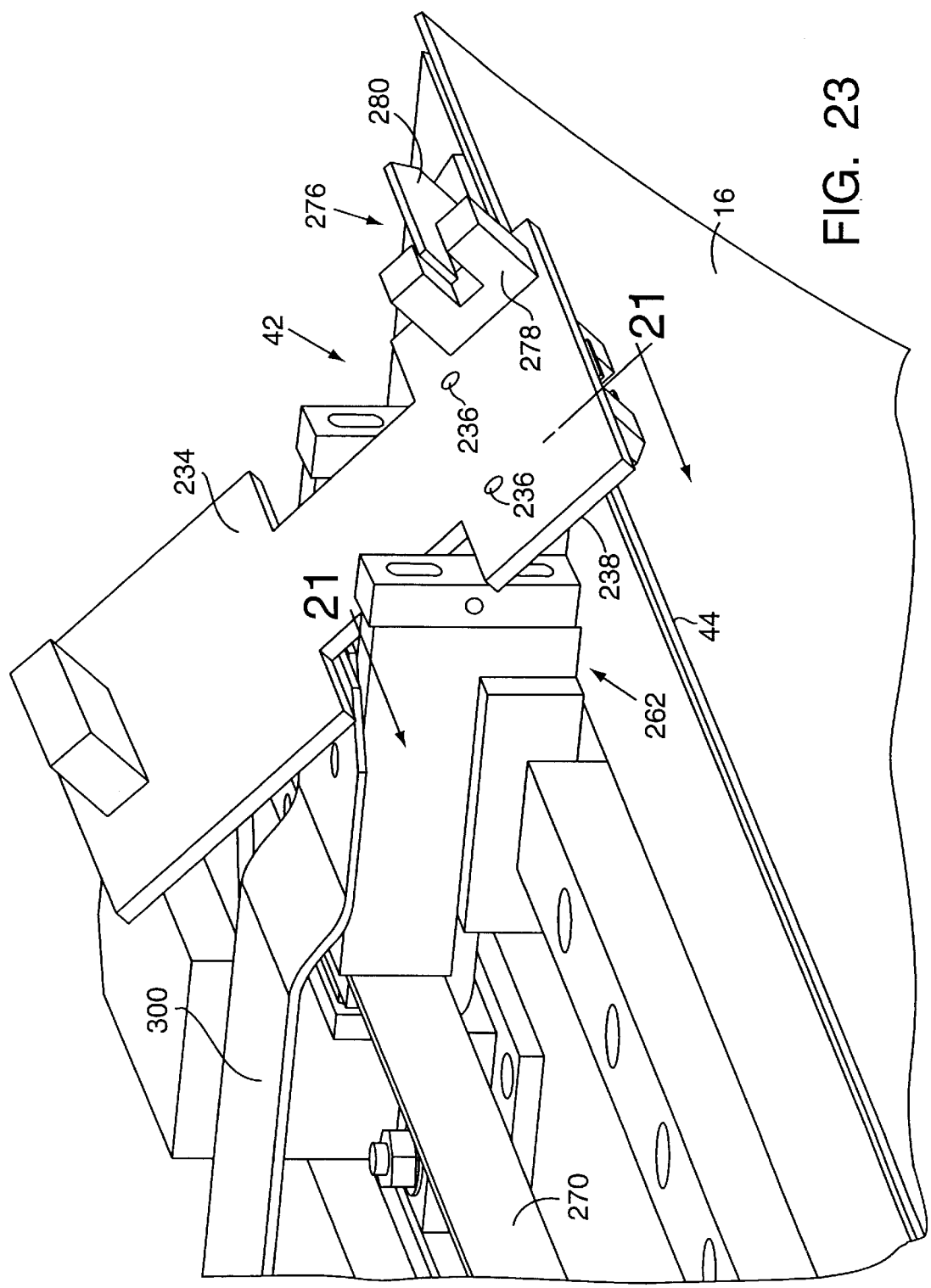
FIG. 23 is an expanded, perspective view of the docking sensor of FIG. 19.

Referring to FIG. 23, the drive mechanism 260 further comprises a home position sensor 276, similar to the home position sensors 180–182 of the drive assemblies 24–26 described earlier, disposed at one end of the guide strip 264.

The sensing element 278 is mounted to the circuit board 234 and the plate 280 is mounted at the forward edge 44 of the internal drum 16 at a predetermined location. The home position sensor 276 provides a signal to the controller 54 representative of docking sensor disposed at the known home position.

Figure 24:
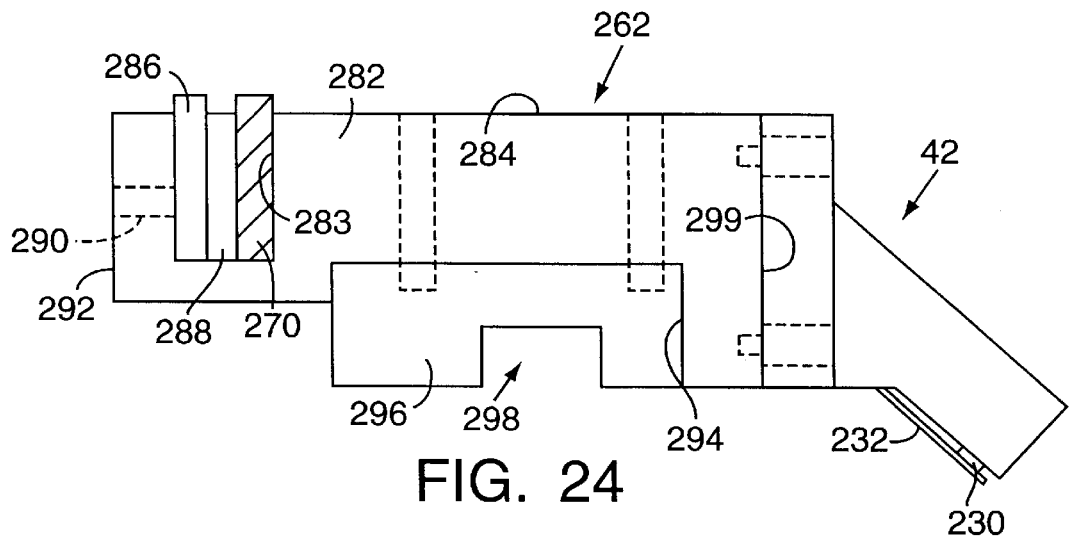
FIG. 24 is an expanded, side elevational view of the carriage and docking sensor of FIG. 23.

As best shown in FIG. 24, the sensor carriage 262 is a generally rectangular block 282 having a groove 283 disposed in the upper surface 284 of the rear portion of the block. The belt 270 is secured within the groove 283 by a pressure plate 286 and a strip of gripping material 288, such as a strip of belt. A pair of set screws 290 are threaded through a pair of bores disposed in the rear wall 292 of the carriage 262. The screws are tightened to engage the pressure plate, and gripping strip to clamp the belt to the sensor carriage 262. The gripping strip 288 is provided between the pressure plate and belt to prevent slippage of the sensor carriage along the belt.

The carriage 262 also includes a U-shaped groove 294 in the central portion of the bottom surface of the block 282 for receiving a slide block 296 mounted therein. The bottom surface of the slide block has a groove 298 complementary with the guide strip 264 for slidable engagement therewith. The docking sensor 42 is mounted to the forward surface 299 of the sensor carriage. The top edge of the forward surface is chamfered to accommodate the circuit board mounted to the top surface of the docking sensor.

Referring to FIG. 23, the carriage 262 further includes a cable support 300 mounted to the upper surface 284 of the sensor carriage. The cable support provides a horizontal surface elevated above the belt 270 of the carriage drive mechanism 260 to prevent entanglement of the cable and the belt.

Figure 25:
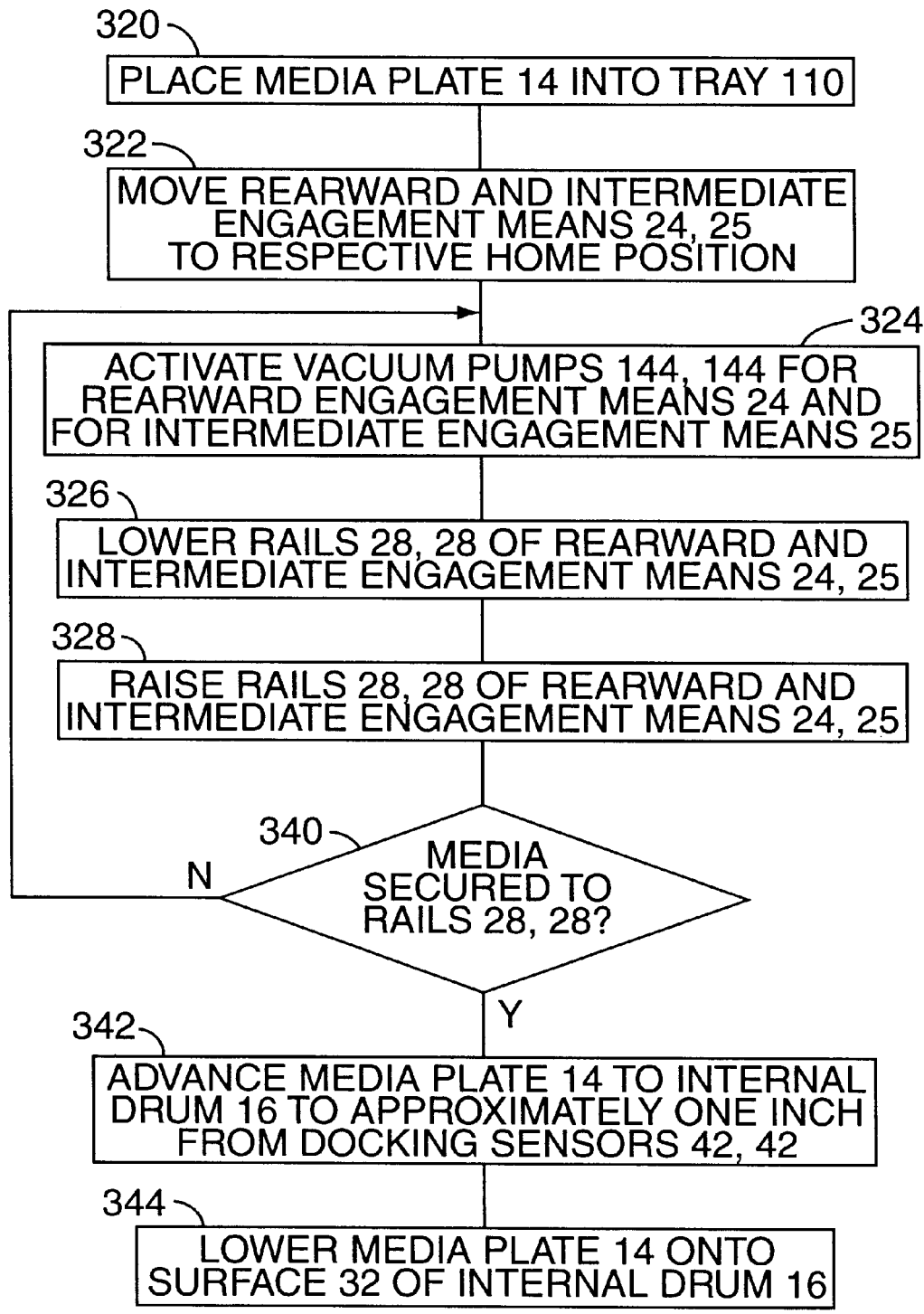
FIG. 25 is a functional diagram of a preferred sequence of operations of the imaging device of FIG. 1 for loading medium onto the internal drum.

Referring to flow diagrams of FIG. 25, the operation of the media feed apparatus 10 for loading an initial unscanned plate of media 14 onto the internal drum 16 is described hereinafter. Referring to block 320, a single or stack of media plates are first placed within the media tray 110. To expose the tray for placement of the media therein, the tray is first pulled outwardly from the media feed apparatus and the piston is actuated to pivot the tray upward away from the tracks 20,20. After the media is placed within the tray, the piston is actuated to lower the tray to a horizontal position.

The controller 54 (see block 322) then provides a signal to the servo motors 154,154 to move the engagement means 24,25 from their respective initial position to their respective home positions. The rearward engagement means 24 is positioned approximately one inch from the trailing edge of the media plate 14. The rail 28 of the intermediate engagement means is positioned approximately one inch from the leading edge of the media plate. Referring to block 324, the controller 54 then provides an actuation signal to each vacuum pump 146,146 for the rearward engagement means 24 and the intermediate engagement means 25. In block 326, the controller 54 then provides a signal to the pneumatic pistons 158,158 of the rails 28,28 of the rearward and intermediate engagement means 24,25, resulting in the lowering of their respective rails to draw the media plate 14 to the cups of the rails. In block 328, the pistons 158,158 are then actuated to raise the rails to thereby lift the media 14 out of the tray 110. In block 340, the vacuum sensor 145 of each rail 28,28 is checked to verify that sufficient vacuum pressure is present to secure the media plate 14 to the cups. If an engagement means is unable to lift the media, the steps in blocks 324–328 are repeated. If the rails fail to lift the media plate after three attempts, the controller aborts the loading process and provides an error indication to the operator.

In block 342, the controller then provides a drive signal to command the servo motors 154,154 to move the media forward in the direction of arrow A along the tracks 20,20 at a predetermined rate. As the intermediate engagement means 25 advances over the arcuate portions 108,108 of the tracks, the rate of travel of the intermediate drive assemblies 30,30 are adjusted to account for the change between the rate of travel of the intermediate drive assembly and the rate of travel of the rearward drive assemblies 24,24 to prevent the forward edge of the media 14 from disengaging from the intermediate engagement means or stretching and bunching of the media plate. For example, as the leading edge of the media plate travels over the arcuate portion 108 above the drum 16, the drive assembly 30 for the intermediate engagement means 25 is slowed a predetermined amount so the leading and trailing edge are traveling at the same velocity. Similarly, as the leading edge of the media plate 14 travels along the arcuate portion 108 about the drum, the velocity of the intermediate engagement means 25 must be increased. The rails 28,28 continue advancing the media 14 to less than one-half inch from the docking sensors 42,42. In block 344, the controller 54 provides signals to the pistons 158 to lower the unscanned media onto the internal drum.

Figure 26:
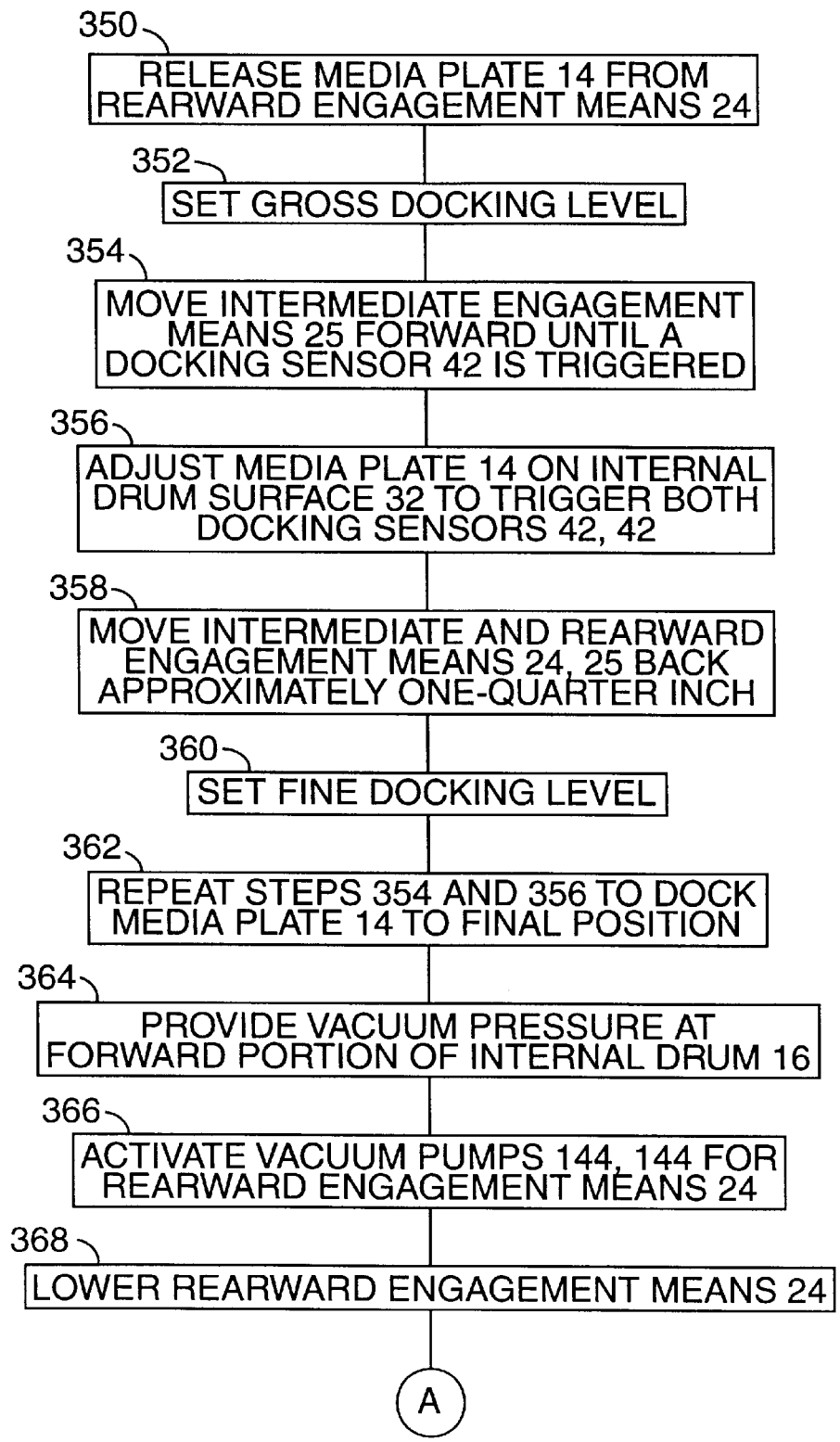
FIGS. 26 and 27 are functional diagrams of a preferred sequence of operations of the imaging device of FIG. 1 for docking medium onto the internal drum.
Figure 27:
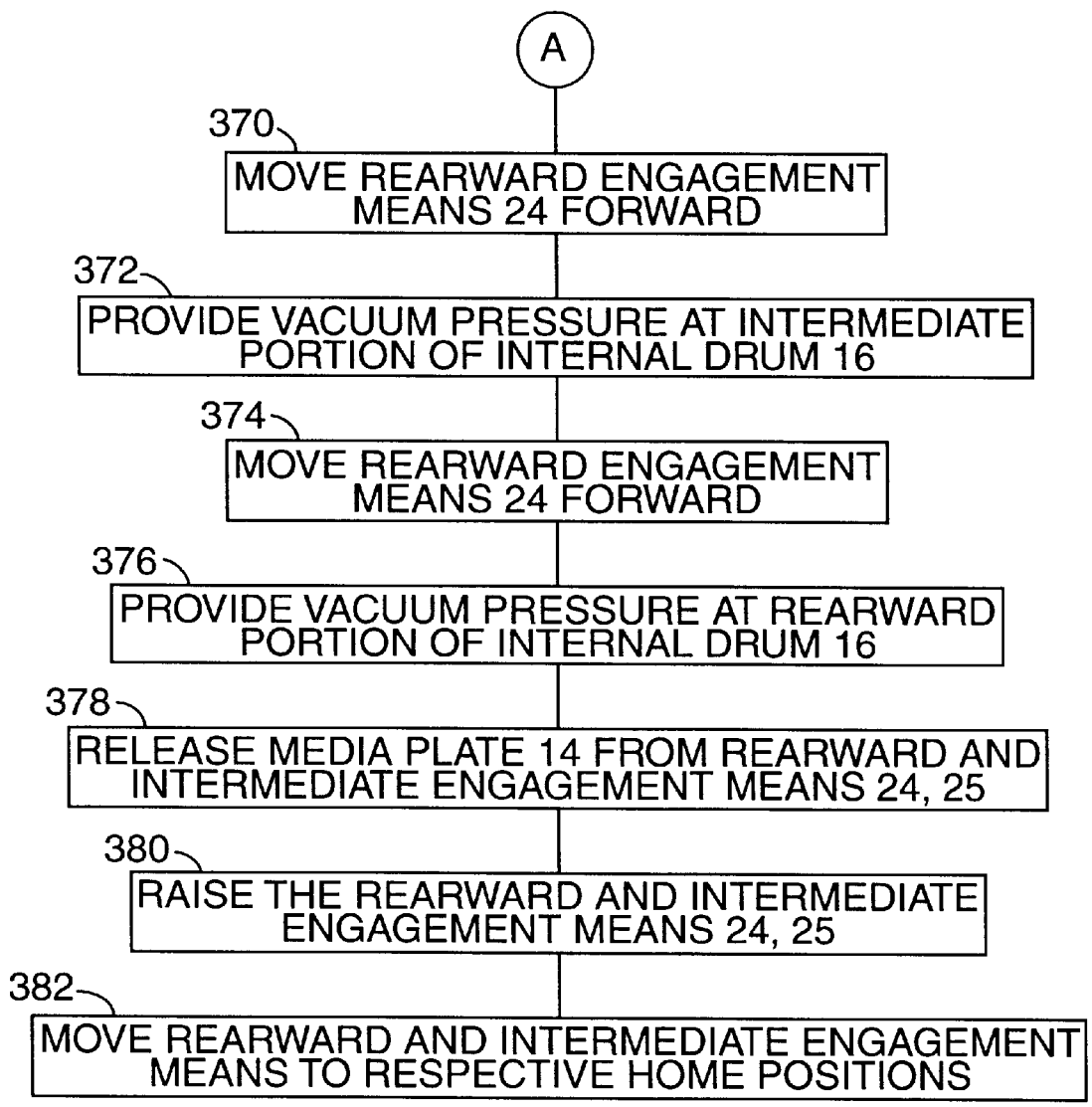

Referring to flow diagrams of FIGS. 26 and 27, the docking procedure of the media 14 on the drum is described in blocks 350–382. First, the controller 54 provides a signal to the vacuum pump 146 of the rearward engagement means 24 to remove vacuum pressure from the cups and thereby release the media. The controller 54 then sets an initial gross docking level for the docking sensors 42,42. The intermediate engagement means 25 is then commanded to move forward at a predetermined rate until the leading edge of the media plate contacts one or both of the docking sensors sufficient to trigger one of the docking sensors. A docking sensor 42 is triggered when the media plate 14 is positioned against the docking sensor such that the HET 226 provides a signal equal to the gross docking level. Based upon which docking sensor has not triggered, the corresponding drive assembly 30 is moved forward while the other drive means remains stationary. The corresponding servo motor 154 continues to move forward until the other docking sensor is triggered. The rearward and intermediate engagement means 24,25 are moved back approximately one-quarter inch.

After the media plate is roughly docked onto the internal drum, the controller 54 resets the docking levels to a fine docking level. The steps in blocks 354 and 356 are then repeated to dock the media to its final position. In block 354, the rate of travel of the engagement means 24,25 are reduced to minimize the period of deceleration thereof. The positioning of the media plate 14 onto the drum 16 is within 0.001 inches of the desired position. The controller 54 then turns on the vacuum pressure at the forward portion of the drum 16 to secure the leading portion of the media thereto. Vacuum pressure at the rearward engagement means 25 is provided and the rail is lowered to engage the trailing edge of the media 14. The rearward engagement means is then commanded to move forward a predetermined distance. The controller then turns on the vacuum pressure at the intermediate portion of the drum to secure the intermediate portion of the media thereto. The rearward engagement means 24 is then commanded to move forward a predetermined distance. The controller 54 then turns on the vacuum pressure at the rearward portion of the drum 16 to secure the remaining portion of the media 14. The controller then turns off the vacuum pressure for the rearward and intermediate engagement means. The rails 28,28 of the rearward and intermediate engagement means are then raised. The controller then commands the rearward and intermediate engagement means 24,25 to return to their home positions to load another unscanned media plate 14 disposed within the tray while the other media plate is being scanned. The controller begins scanning of the media as soon as the intermediate engagement means is clear of the media secured to the drum.

Figure 28:
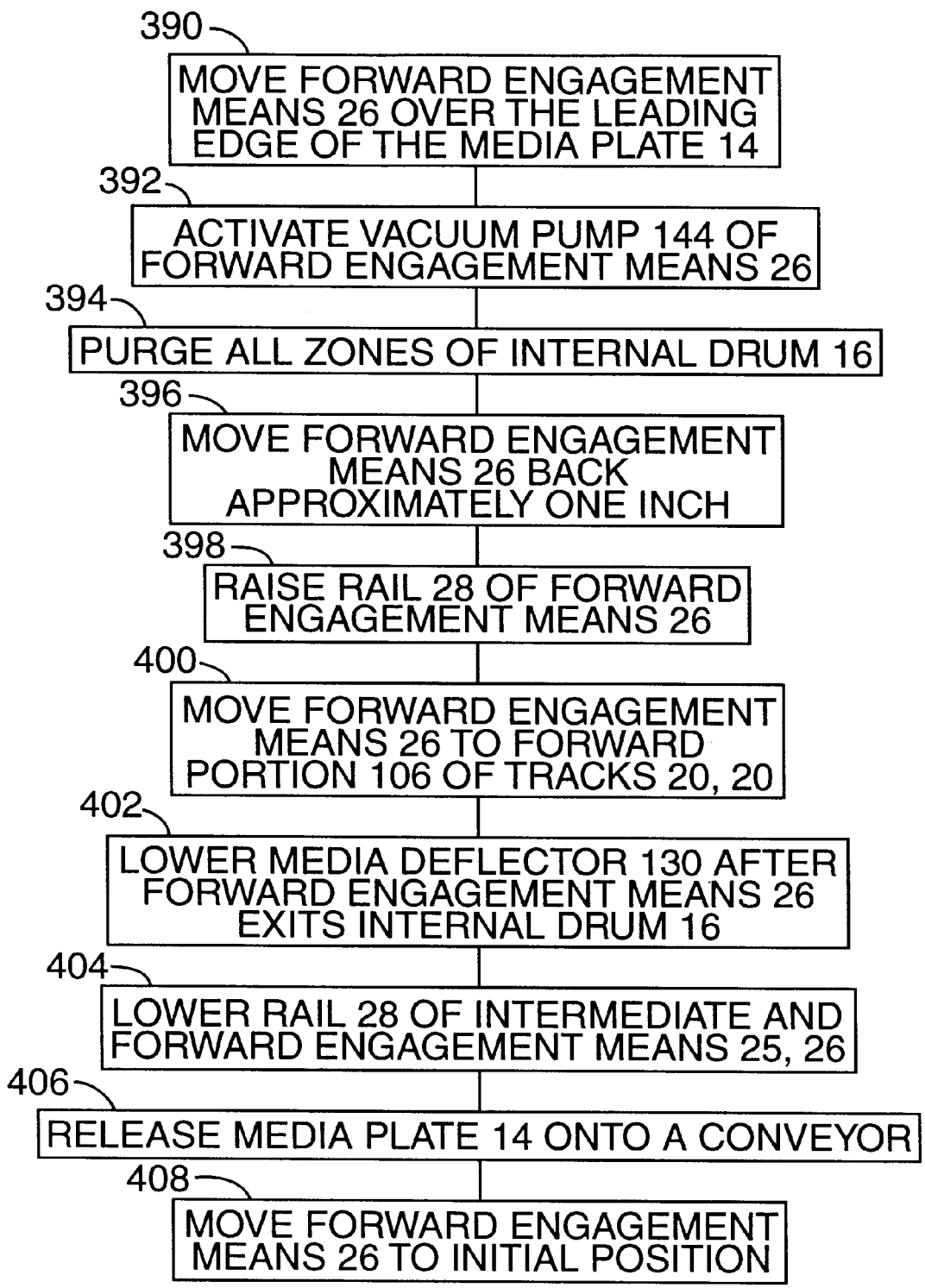
FIG. 28 is a functional diagram of a preferred sequence of operations of the imaging device of FIG. 1 for removing medium from the internal drum.

Referring to FIG. 28, the unloading procedure of a single plate of media 14 from the internal drum 16 is described in blocks 390–408 whereby the media plate is unloaded using only the forward engagement means 26. First, the controller 54 commands the forward engagement means 26 to move to a position over the leading edge of the media plate approximately one inch from its edge. Vacuum pressure is applied to the cups of the forward engagement means 26 and the corresponding rail 28 is lowered to engage the leading edge of the media plate. The controller 54 purges all three zones of the internal drum 16 forcing the media plate away from the scanning surface 32 of the drum. The controller then commands the forward engagement means 25,26 back approximately one inch and thereby advancing the leading edge of the media an inch back from the docking sensors 42,42. The rail 28 of the forward engagement means 26 is lifted to raise the media above the docking sensors 42,42.

The controller 54 then commands the forward engagement means 26 forward at a predetermined velocity. After the forward engagement means clears the internal drum 16, the controller 54 actuates a pair of solenoids 138,138 to lower the media deflector 130 into the internal drum 16. As the media plate 14 is pulled from the internal drum, the deflector rollers 132 contact the trailing portion of the media and guide the trailing portion of the media plate out from the internal drum 16 to prevent the trailing portion from snapping up and contacting the spar 70 and scanning means 68. After the media is removed from the internal drum, the controller actuates the solenoid to return the media deflector 130 upward, clear of the internal drum. The forward engagement means is moved to the forward portion of the tracks 20,20. The rail 28 of the forward engagement means is then lowered and the vacuum pressure is removed from the cups to place the scanned media plate onto a conveyor. The controller then commands the forward engagement means to return to its initial position.

Figure 29:
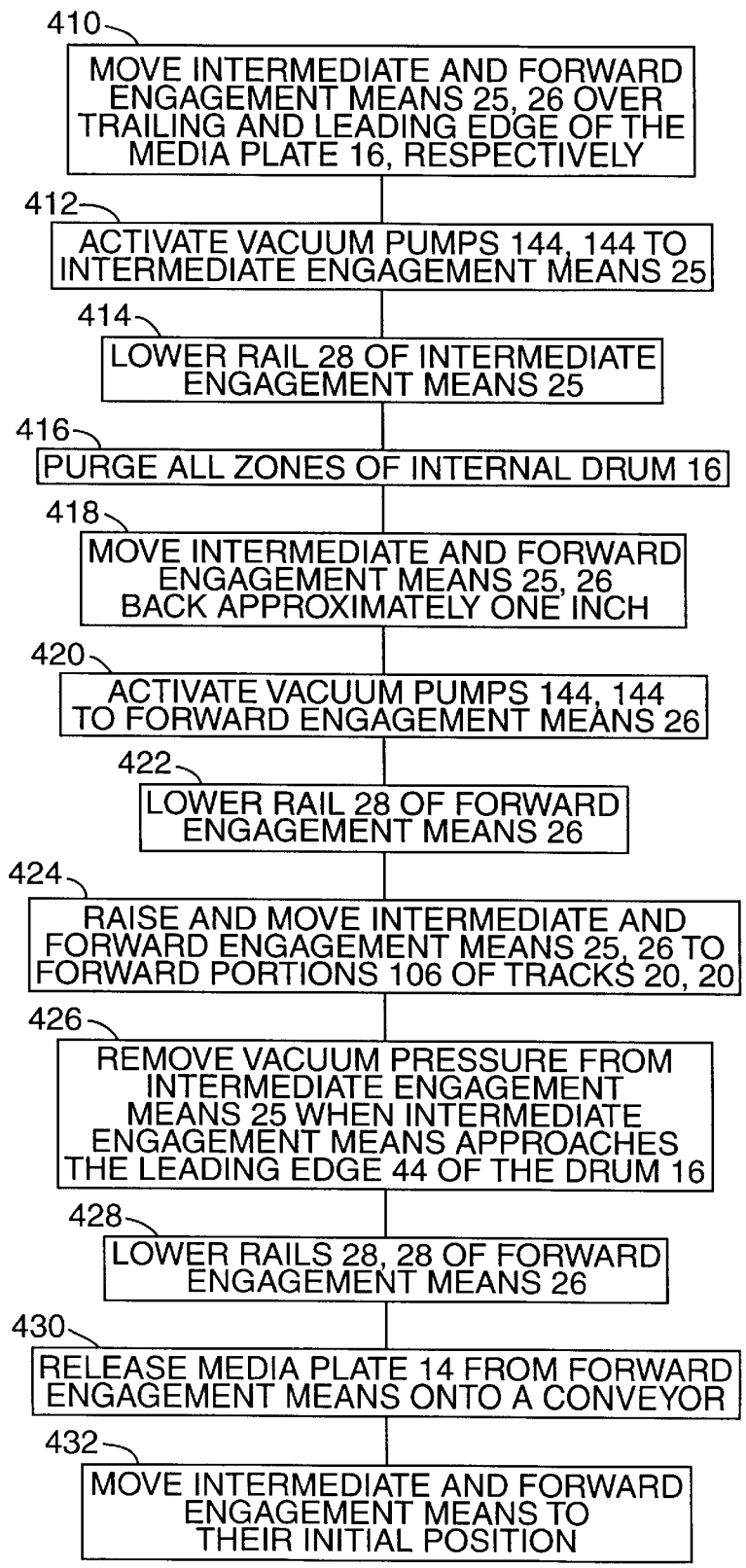
FIG. 29 is a functional diagram of an alternative sequence of operations of the imaging device of FIG. 1 for removing medium from the internal drum.

The flow diagrams of FIG. 29 illustrate an alternative unloading procedure of a single plate of media 14 from the internal drum 16 shown in blocks 410–432. First, the controller 54 commands concurrently the intermediate engagement means 25 to move to a position over the trailing edge of the media plate approximately one inch from its edge and the forward engagement means 26 to move to a position over the leading edge of the media plate approximately one inch from its edge. Vacuum pressure is applied to the cups of the intermediate engagement means 25 and the corresponding rail is lowered to engage the trailing edge of the media plate. The controller 54 purges all three zones of the internal drum 16 forcing the media plate away from the scanning surface 32 of the drum. The controller then commands the intermediate and forward engagement means 25,26 back approximately one inch and thereby pull the leading edge of the media an inch back from the docking sensors 42,42. The vacuum pressure is then applied to the cups of the forward engagement means 26 and the rail 28 is then lowered to engage the leading edge of the media plate 14. Both the rails 28,28 of the intermediate and forward engagement means 25,26 are lifted to raise the media above the docking sensors 42,42. The controller 54 then commands the intermediate and the forward engagement means to move to the forward portion of the tracks 20,20. When the intermediate engagement means 25 approaches the forward edge 44 of the drum 16, vacuum pressure is removed from the cups of the intermediate engagement means. The rail 28 of the forward engagement means 26 is then lowered and the vacuum pressure is removed from the cups to place the scanned media onto a conveyor. The controller then commands the engagement means to return to their initial position.

Figure 30:
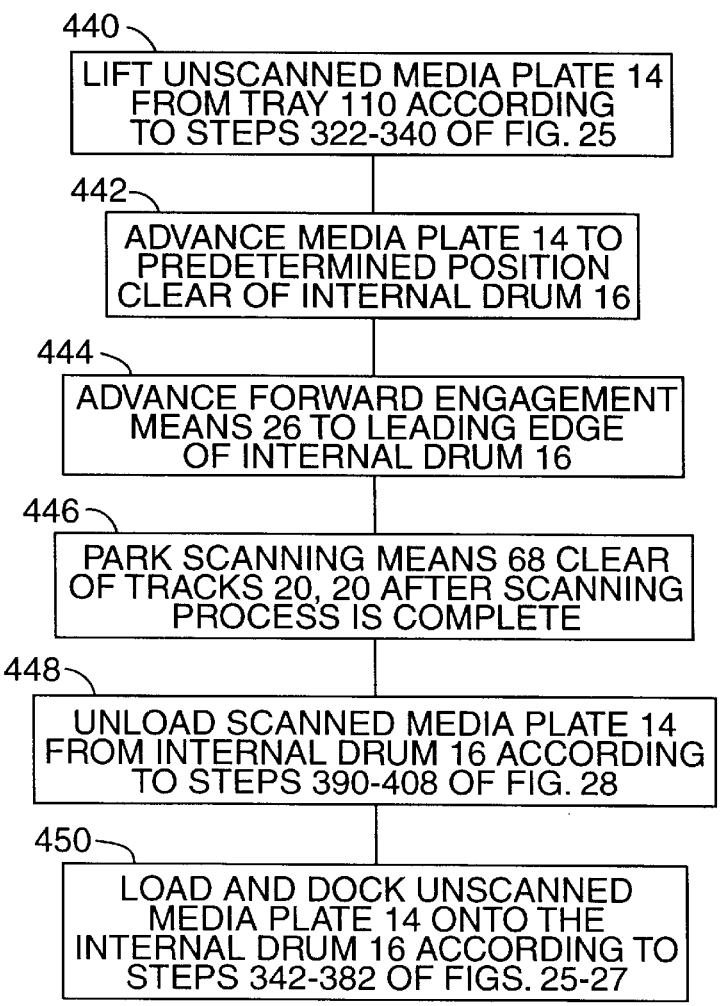
FIG. 30 is a functional diagram of an alternative sequence of operations of the imaging device of FIG. 1 for simultaneously loading and unloading a pair of mediums.

The flow diagrams of FIG. 30 illustrates, in blocks 440–450, the operation of the media feed apparatus 10 to load a subsequent plate 14 of unscanned media onto the internal drum 16 while simultaneously unloading a scanned media plate from the drum 16. The rearward engagement means 24 and the intermediate engagement means 25 secure the top unscanned media plate of the stack or individual unscanned plate loaded onto the media tray 110 as shown in blocks 322–340 of FIG. 25, described hereinabove. The media is advanced along the tracks 20,20 to a predetermined point clear of the trailing edge of the internal drum 16. The forward engagement means 26 is moved backward to a predetermine point clear of the forward edge 44 of the internal drum.

When the scanning process is complete, the scanning assembly is parked clear of the tracks 20,20. The controller 54 then commands the forward engagement means 26 to unload the scanned media according to steps shown in blocks 390–408 of FIG. 28. The controller commands concurrently the rearward and intermediate engagement means forward to load and dock the unscanned media according to steps 342–382 shown in FIGS. 25–27.

The controller 54 then commands the rearward and intermediate engagement means 24,25 to return to their home positions to load another unscanned media plate disposed onto the tray 110, while the other media plate is being scanned. The controller begins scanning of the media as soon as the intermediate engagement means 25 is clear of the media secured to the drum 16.

Figure 31:
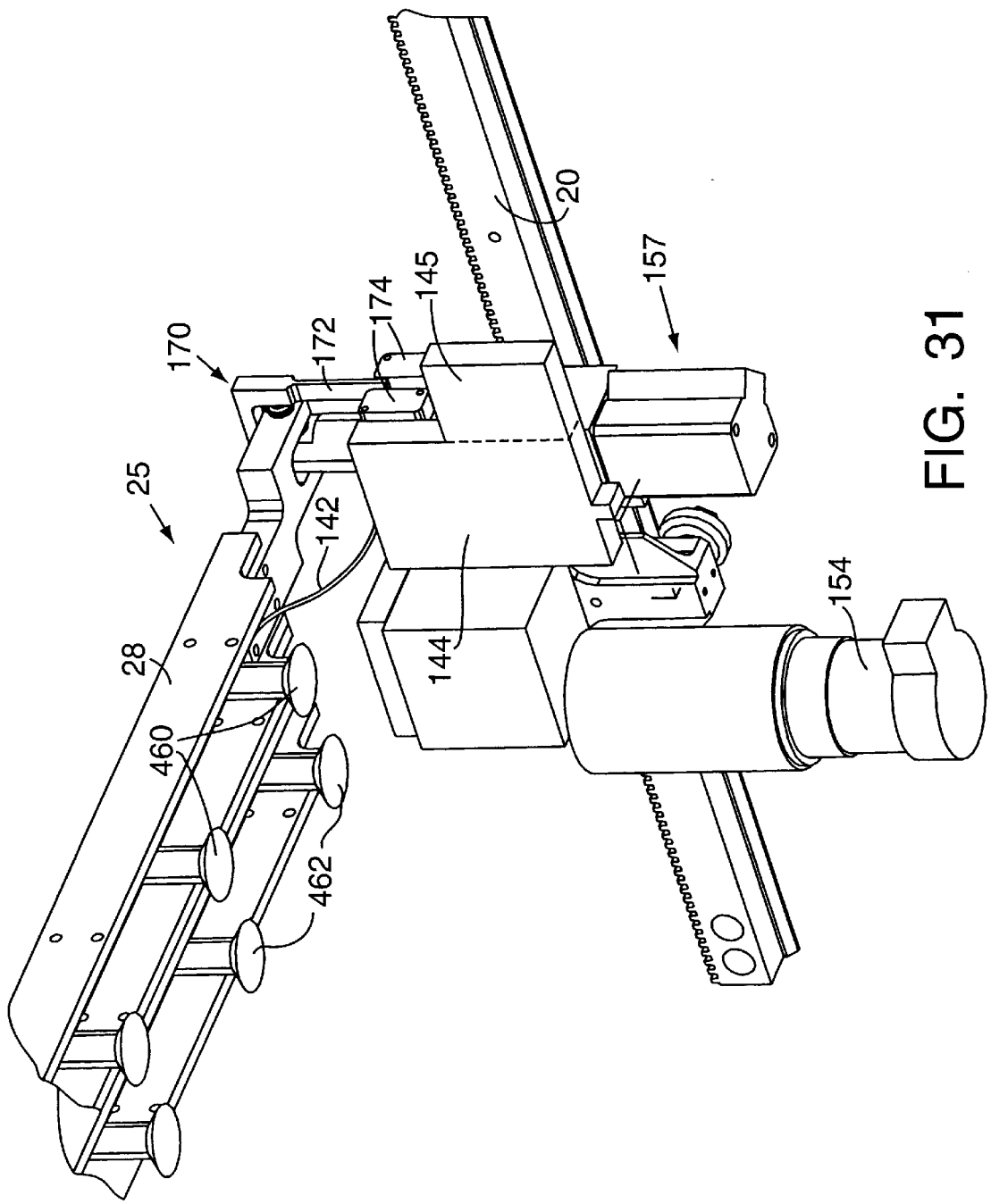
FIG. 31 is an inner expanded, perspective view of an alternative embodiment of the intermediate engagement means provided in accordance with the present invention.

In an alternative embodiment shown in FIG. 31, the rail 28 of the intermediate engagement means 25 includes a forward row of cups 460 and a rearward row of cups 462 along the bottom surface of the rail. The rearward row of cups 462 are adapted to engage the leading edge of a media plate 14 and the forward row of cups 460 are adapted to engage concurrently the trailing edge of a second adjacent media plate. The intermediate engagement means 25 can thereby guide the forward edge of the trailing media plate for loading onto the drum 16 while, at the same time, guiding the trailing edge of the scanned media plate away from the drum. The dual function of the intermediate engagement means therefore eliminates the need for the media deflector 130.

The intermediate engagement means 25 is substantially similar to the intermediate engagement means described hereinabove, except for the additional row of cups. Furthermore, vacuum pressure for each row of cups is provided by an independent vacuum pump 145 and vacuum sensor 144, each of which are mounted to one of the drive assemblies 30,30.

Figure 32:
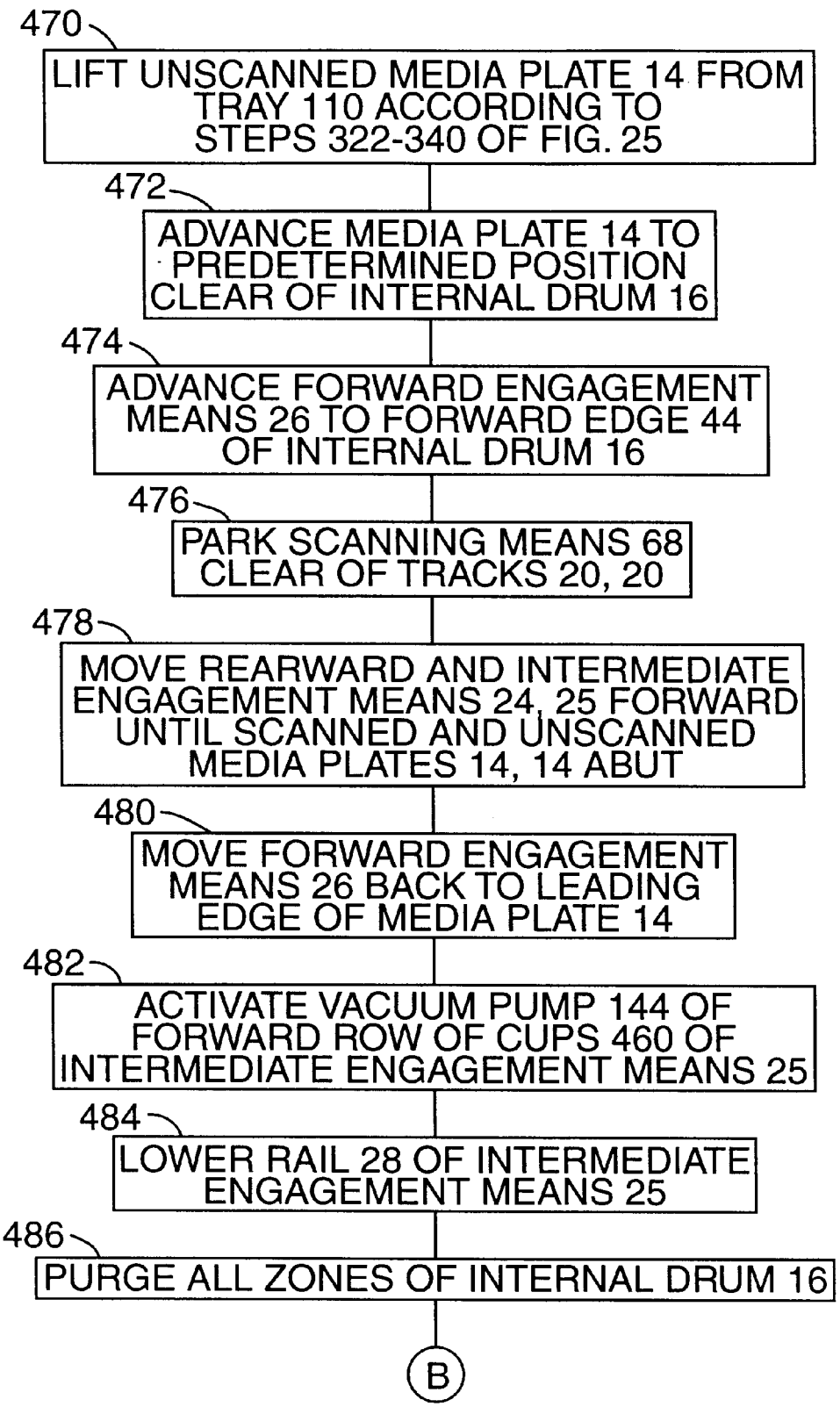
FIGS. 32 and 33 are functional diagrams of an alternative sequence of operations of the alternative embodiment of FIG. 31 for simultaneously loading and unloading a pair of mediums.
Figure 33:
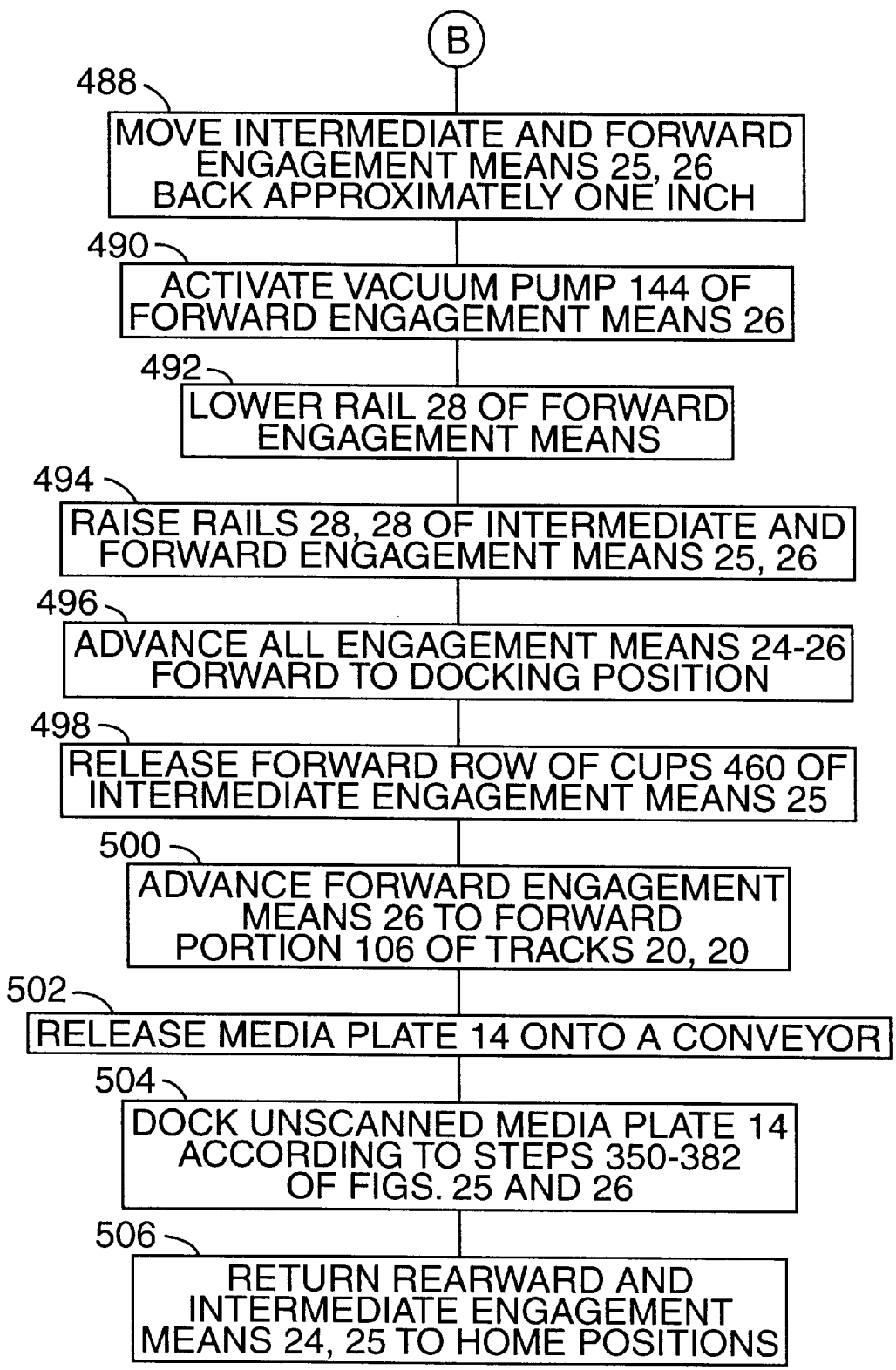

The flow diagrams of FIGS. 32 and 33 illustrate, in blocks 470–506, the operation of the media feed apparatus 10 to load a subsequent plate 14 of unscanned media onto the internal drum 16 while simultaneously unloading a scanned media plate from the drum 16. The rearward engagement means 24 and the intermediate engagement means 25 secure the top unscanned media plate of the stack or individual unscanned plate loaded onto the media tray 110 as shown in blocks 322–340 of FIG. 25, described hereinabove. The next media plate is advanced along the tracks 20,20 to a predetermined point clear of the trailing edge of the internal drum 16 as the first media plate is being scanned. The forward engagement means 26 is moved back to a predetermined point clear of the forward edge 44 of the internal drum.

When the scanning process is complete, the scanning assembly is parked clear of the tracks 20,20. The controller commands the rearward engagement means 24 and the intermediate engagement means 25 forward so that the leading edge of the unscanned media plate is adjacent the scanned media plate. The drive assemblies of the forward engagement means 26 are commanded by the controller 54 to move backwards in the direction of arrow B until the rail 28 is positioned above the scanned media approximately one inch from its leading edge. The controller provides a signal that energizes the vacuum pump 144 to apply vacuum pressure to the forward row of cups 460 disposed on the intermediate engagement means 25. The rail 28 of the intermediate engagement means 25 is lowered to engage the trailing edge of the scanned media.

The controller 54 purges all three zones of the internal drum 16 forcing the media plate away from the scanning surface 32 of the drum. The controller then commands each of the engagement means 24–26 back approximately one inch and thereby pull the leading edge of the scanned media an inch back from the docking sensors 42,42. The vacuum pressure is then applied to the cups of the forward engagement means 26 and the rail 28 is then lowered to engage the leading edge of the media plate. Both the rails of the intermediate and third engagement means are lifted to raise the media above the docking sensors. The controller then commands each of the engagement means forward until the intermediate engagement means 24–26 reaches the docking position for the unscanned media plate. The vacuum pressure is then removed from the forward row of cups 460 to release the trailing edge of the scanned media 14. The forward engagement means is advanced to the forward portion 106 of tracks 20,20. The rail 28 of the forward engagement means is lowered and the vacuum pressure is removed to place the media plate onto a conveyor. The controller 54 then commands the forward engagement means to return to their initial position. As the forward engagement means unloads the scanned media plate, the unscanned plate is docked according to the steps shown in blocks 350–382 of FIGS. 26 and 27.

The controller 54 then commands the rearward and intermediate engagement means 24,25 to return to their home positions to load another unscanned media plate disposed onto the tray 110, while the other media plate is being scanned. The controller begins scanning of the media as soon as the intermediate engagement means 25 is clear of the media secured to the drum 16.

One skilled in the art would recognize that the media feed apparatus may be used with smaller imaging devices for scanning media plates for 4-up and 8-up format printing.

An important advantage of the media feed apparatus of the present invention is large sheets of media may be easily loaded onto and off of an internal drum imager by one individual and thereby reduce the cycle time and cost to scan a plate of media.

Another advantage is that the clearance between the scanning assembly and the internal drum may be reduced which allows the internal drum to circumferentially extend greater than 180 degrees and thereby reduce the radius of the drum. As described earlier, the reduction of the radius of the drum increases the immunity of the imaging beam to air turbulence in the exposure chamber and also the size of the imaging device.

Yet another advantage is that the controller may accurately position the media plate onto the internal drum to a very tight tolerance in response to feedback provided by the docking sensors.

Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

Having thus described my invention, what is claimed is:

1. A media feed apparatus for use in an imaging system for loading medium onto and unloading medium off of an internal drum of the imaging system, the drum having a rearward edge and forward edge, the imaging device further including a scanning assembly disposed within the internal drum parallel to the central axis of the internal drum, the apparatus comprising:

a support structure;

a pair of parallel tracks secured to said structure, said tracks having a rearward portion extending generally perpendicular from the rearward edge of the internal drum, an intermediate portion adjacent outer edges of the internal drum and a forward portion extending generally perpendicular from the forward edge of the internal drum;

a forward engagement means movably coupled between said tracks for coupling a leading edge portion of the medium and transporting the medium to and from the internal drum along said tracks, said engagement means including:

a rail extending between said tracks;

a drive means secured to each end of said rail for advancing said rail along the tracks, in response to drive signals; and a coupling means mounted to said rail for securing the media to said rail in response to coupling signals; and a controller for generating said drive signals and said coupling signals in response to received media advancement signals.

2. A media feed apparatus for an imaging system, as set forth in claim 1, wherein the apparatus further comprises a rearward engagement means for coupling to a trailing edge portion of the medium, said rearward engagement means including:

a rail extending between said tracks;

a drive means secured to each end of said rail for advancing said rail along the tracks, in response to drive signals; and a coupling means mounted to said rail for securing the medium to said rail in response to coupling signals.

3. A media feed apparatus for an imaging system, as set forth in claim 2, wherein the apparatus further comprises an intermediate engagement means disposed along the tracks between the rearward engagement means and the forward engagement means, said intermediate engagement means including:

a rail extending between said tracks;

a drive means secured to each end of said rail for advancing said rail along the tracks, in response to drive signals; and a coupling means mounted to said rail for securing the medium to said rail in response to coupling signals.

4. A media feed apparatus for an imaging system, as set forth in claim 2, wherein the apparatus further comprises an intermediate engagement means disposed along the tracks between the rearward engagement means and the forward engagement means, said intermediate engagement means including:

a rail extending between said tracks;

a drive means secured to each end of said rail for advancing said rail along the tracks, in response to drive signals;

a first coupling means mounted to along a rearward edge of a bottom surface of said rail for securing the medium to said rail in response to first coupling signals; and a second coupling means mounted to along the forward edge of the bottom surface of said rail for securing a second medium to said rail in response to second coupling signals.

5. A media feed apparatus for an imaging system, as set forth in claim 4, wherein the controller independently generates said first coupling signals and second coupling signals in response to received media advancement signals.

6. A media feed apparatus for an imaging system, as set forth in claim 2, wherein a forward engagement means includes a skew limit sensor mounted to one end of said rail, said skew limit sensor providing a skew feedback signal representative of the degree of rotation of said rail in said second plane.

7. A media feed apparatus for an imaging system, as set forth in claim 6, wherein the skew limit sensor includes:

a pair of contact switches laterally-spaced a predetermined distance, each contact switch providing a skew feedback signal when actuated; and a wiper having an upper end mounted to one end of said rail and a lower end disposed between said contact switches for actuating one of said switches when the rail pivots a predetermined degree of rotation in said second plane.

8. A media feed apparatus for an imaging system, as set forth in claim 2, wherein the forward engagement means and rearward engagement means each further comprises a respective vacuum pump for providing vacuum pressure to each of said respective coupling means, in response to respective coupling signals.

9. A media feed apparatus for an imaging system, as set forth in claim 8, wherein the controller independently generates said respective coupling signals for selectively actuating said respective coupling means in response to received media advancement signals.

10. A media feed apparatus for an imaging system, as set forth in claim 1, wherein the support structure is mechanically isolated to the internal drum and scanning assembly.

11. A media feed apparatus for an imaging system, as set forth in claim 1, wherein the coupling means comprises a plurality of cups laterally-spaced along the bottom surface of said rail.

12. A media feed apparatus for an imaging system, as set forth in claim 1, wherein each drive assembly further comprises an upper pair of sheaves and a lower pair of sheaves for movably coupling to an upper surface and lower surface, respectively, of said tracks.

13. A media feed apparatus for an imaging system, as set forth in claim 1, wherein each drive means comprises:

a servo motor having a shaft;

a rack gear disposed along a side surface of said track; and a pinion gear attached to said shaft, said pinion gear meshed with said rack gear to advance the drive means along the track, in response to said drive signals provided to said servo motor.

14. A media feed apparatus for an imaging system, as set forth in claim 1, wherein each of said drive means of said forward engagement means includes a lifting means attached to the ends of said rail for raising and lowering said rails perpendicular to the plane defined by the tracks, in response to received lifting signals.

15. A media feed apparatus for an imaging system, as set forth in claim 14, wherein each lifting means is pivotally attached to the ends of said rails to permit pivotable movement of the rail in a direction perpendicular to the surface of the medium.

16. A media feed apparatus for an imaging system, as set forth in claim 14, wherein the lifting means is pivotally attached to the ends of said rails to permit pivotable movement of the rail in a plane parallel to a second plane defined by said tracks.

17. A media feed apparatus for an imaging system, as set forth in claim 14, wherein the lifting means comprises a pneumatic piston.

18. A media feed apparatus for an imaging system, as set forth in claim 14, wherein the lifting means comprises:
   a spring having one end engaging said rail and an other end engaging said drive means for urging the end of said rail upward;
   a cable assembly interconnecting said rail to said pair of drive means; and
   an actuator engaging said cable assembly for tensioning said cable resulting in the lowering of said rail a predetermine distance in response to said coupling signals.

19. An imaging system, as set forth in claim 18, further the media feed apparatus comprises a pair of docking sensors axially-spaced at an edge of the internal drum; said docking sensors extend over the edge of the internal drum for contacting an edge of the medium loaded into the internal drum; each of said docking sensors generating a signal representative of the position of a contact point of the edge of the medium on the drum.

20. An imaging system, as set forth in claim 18, wherein the support structure is mechanically isolated to the internal drum and scanning assembly.

21. An imaging system, as set forth in claim 18, wherein the apparatus further including a medium deflector disposed between the scanning assembly and the forward edge of the internal drum for guiding a trailing edge the medium; said deflector slidably engages said structure; and a lifting means for advancing said medium deflector into and out of the internal drum.

22. An imaging system, as set forth in claim 18, wherein said internal drum is partially cylindrical having scanning surface extending circumferentially greater than 180 degrees.

23. A media feed apparatus for an imaging system, as set forth in claim 1, wherein the apparatus further includes medium support disposed between arcuate portions of the tracks.

24. A media feed apparatus for an imaging system, as set forth in claim 1, wherein the medium support includes a plurality of rollers disposed along a plurality of axles.

25. A media feed apparatus for an imaging system, as set forth in claim 1, wherein the apparatus further including a medium deflector disposed between the scanning assembly and the forward edge of the internal drum for guiding a trailing edge the medium; said deflector slidably engages said structure; and a lifting means for advancing said medium deflector into and out of the internal drum.

26. A media feed apparatus for an imaging system, as set forth in claim 1, wherein the apparatus further includes a plurality of position sensors mounted to said structure at predetermined locations adjacent of the tracks, said position sensors providing a position feedback signal indicative of the position of a particular drive assembly at a predetermined location on said tracks.

27. A media feed apparatus for an imaging system, as set forth in claim 1, wherein the apparatus further includes a tray for supporting a medium for loading onto the internal drum, said tray being slidably and pivotally secured to the structure disposed between the tracks of the forward portion of the tracks to permit the tray to be pulled clear of said tracks and tilted to an inclined position for easy loading of the medium.

28. A media feed apparatus for an imaging system, as set forth in claim 27, wherein the tray includes an upward extending wall along a bottom edge and a side edge of said tray, the side wall being substantially parallel to said tracks, and the bottom wall being substantially parallel to the forward edge of the internal drum.

29. A media feed apparatus for an imaging system, as set forth in claim 1, wherein the apparatus further includes a pair of docking sensors axially-spaced at an edge of the internal drum; said docking sensors extend over the edge of the internal drum for contacting an edge of the medium loaded into the internal drum; each of said docking sensors generating a signal representative of the position of a contact point of the edge of the medium on the drum.

30. A media feed apparatus for an imaging system, as set forth in claim 29, wherein each of said docking sensors include:
   a mounting frame having an undersurface and top surface;
   a leaf spring having one end secured to said mounting frame, said leaf spring extending below the undersurface of the mounting frame;
   a magnet element mounted to an upper surface of an other end of said leaf spring; and
   a sensing device mounted to the top surface of the mounting frame opposing said magnetic element for sensing the change of the electromagnetic field, said device generating a feedback signal representative of the degree of flexure of the leaf spring relative to a known fixed location.

31. A media feed apparatus for an imaging system, as set forth in claim 29, wherein each of said docking sensors include:
   generating means for providing a measurable change of a property when contacted by the edge of the medium; and
   detecting means for sensing said measurable change and providing a signal representative of said change.

32. A media feed apparatus for an imaging system, as set forth in claim 29, wherein the generating means comprising a magnetic element mounted to a surface of a leaf spring, and the detecting means comprising a Hall Effect device.

33. A media feed apparatus for an imaging system, as set forth in claim 29, wherein the generating means comprising a leaf spring having magnetic permeable material, and the detecting means comprising an inductive proximity sensor.

34. A media feed apparatus for an imaging system, as set forth in claim 29, wherein the generating means comprising a compressible dielectric material, and the detecting means comprising an capacitive sensing device.

35. An imaging system comprising:

a scanning assembly;

an internal drum for securing media to be scanned;

a media feed apparatus for loading and unloading medium onto and off of said internal drum, said apparatus comprising;

a support structure;

a pair of parallel tracks secured to said structure, said tracks having a rearward portion extending generally perpendicular from the rearward edge of the internal drum, an intermediate portion adjacent outer edges of the internal drum and a forward portion extending generally perpendicular from the forward edge of the internal drum;

a forward engagement means movably coupled between said tracks for coupling a leading edge portion of the medium and transporting the medium to and from the internal drum along said tracks, said engagement means including:

a rail extending between said tracks;

a drive means secured to each end of said rail for advancing said rail along the tracks, in response to drive signals; and a coupling means mounted to said rail for securing the media to said rail in response to coupling signals; and a controller for generating said drive signals and said coupling signals in response to received media advancement signals.

36. An imaging system, as set forth in claim 35, wherein the apparatus further comprises a rearward engagement means for coupling to a trailing edge portion of a medium, said rearward engagement means including:

a rail extending between said tracks;

a drive means secured to each end of said rail for advancing said rail along the tracks, in response to drive signals; and a coupling means mounted to said rail for securing the media to said rail in response to coupling signals.

37. An imaging system, as set forth in claim 36, wherein the apparatus further comprises an intermediate engagement means disposed along the tracks between the rearward engagement means and the forward engagement means, said intermediate engagement means including:

a rail extending between said tracks;

a drive means secured to each end of said rail for advancing said rail along the tracks, in response to drive signals; and a coupling means mounted to said rail for securing the medium to said rail in response to coupling signals.

38. An imaging system, as set forth in claim 36, wherein the apparatus further comprises an intermediate engagement means disposed along the tracks between the rearward engagement means and the forward engagement means, said intermediate engagement means including:

a rail extending between said tracks;

a drive means secured to each end of said rail for advancing said rail along the tracks, in response to drive signals;

a first coupling means mounted to along a rearward edge of a bottom surface of said rail for securing the medium to said rail in response to first coupling signals; and a second coupling means mounted to along the forward edge of the bottom surface of said rail for securing a second medium to said rail in response to second coupling signals.

* * * * *